United States Patent [19]

Murray

[11] Patent Number: 4,942,550

[45] Date of Patent: Jul. 17, 1990

[54] PRINTED CIRCUIT BOARD TOPOGRAPHY FOR HIGH SPEED INTELLIGENT INDUSTRIAL CONTROLLER WITH MULTIPLE BOARDS LOCATED WITHIN A SINGLE SLOT

[75] Inventor: Kenneth W. Murray, Livingston, Scotland

[73] Assignee: Burr-Brown Ltd., Livingston, Scotland

[21] Appl. No.: 202,944

[22] Filed: Jun. 6, 1988

[30] Foreign Application Priority Data

Jun. 23, 1987 [GB] United Kingdom ............... 8714639

[51] Int. Cl.$^5$ .............................................. G06F 9/02
[52] U.S. Cl. ................................. 364/900; 364/929.4
[58] Field of Search ........................................ 361/413; 364/200 MS File, 900 MS File

[56] References Cited

U.S. PATENT DOCUMENTS 4,562,535 2/1985 Vincent et al. ..................... 364/200
4,683,550 7/1987 Jindrick et al. ..................... 361/413

Primary Examiner—Lawrence E. Anderson
Attorney, Agent, or Firm—Cahill, Sutton & Thomas

[57] ABSTRACT

An industrial I/O controller is implemented on a processor board and includes two I/O daughter boards which are mounted on and parallel to the processor board by means of connectors such that the entire system occupies only a single slot space of a VMEbus back plane. The processor board includes a VMEbus connector attached to its upper right-hand edge. First buffer circuitry, a static RAM, second buffer circuitry and an EPROM are located from right to left along the upper edge of the processor board. Two connectors for attachment of two I/O daughter boards are located in the lower part of the processor board. All digital and analog input/output circuitry is included on the I/O daughter boards, which cover the lower two-thirds of the processor board, on which a crystal oscillator, an interrupt handler, an interrupt generator, arbitration bus controller circuitry, dynamic RAM, dynamic RAM control circuitry, dynamic RAM decoder circuitry, optical isolation circuitry and optical isolation control circuitry are located. The EPROM, SRAM, interrupt handling and generating circuitry, a programmable timer, and DRAM control and decoding circuitry are located around and close to the microprocessor.

14 Claims, 18 Drawing Sheets

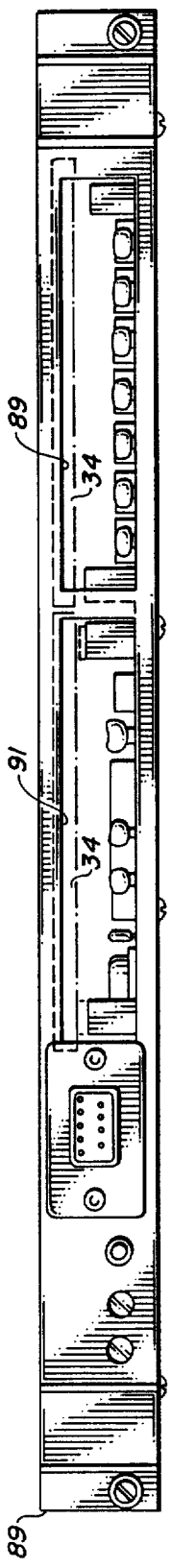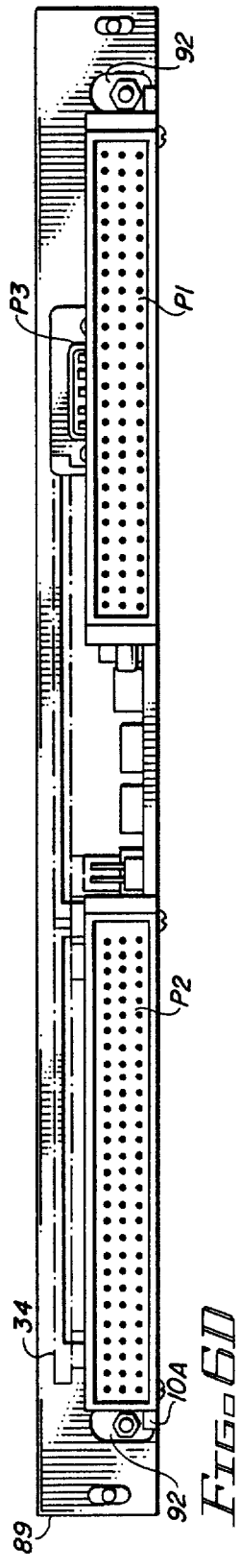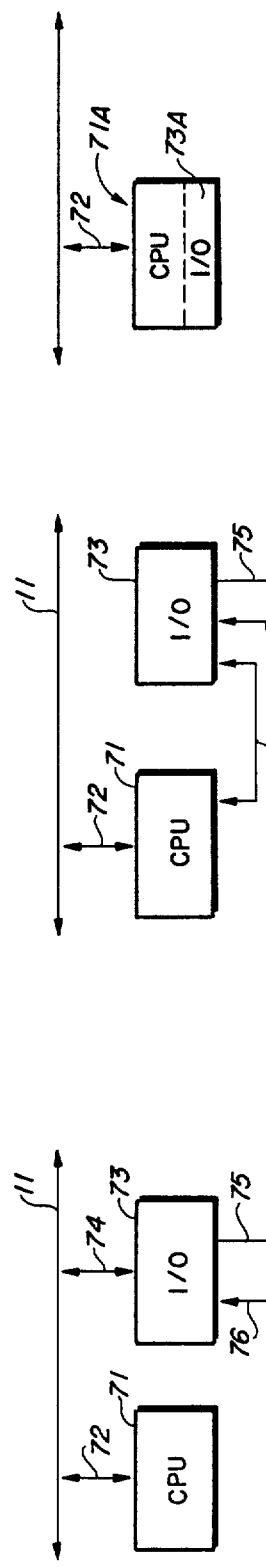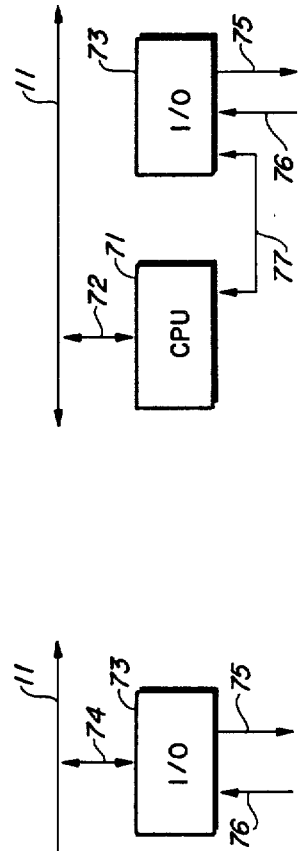

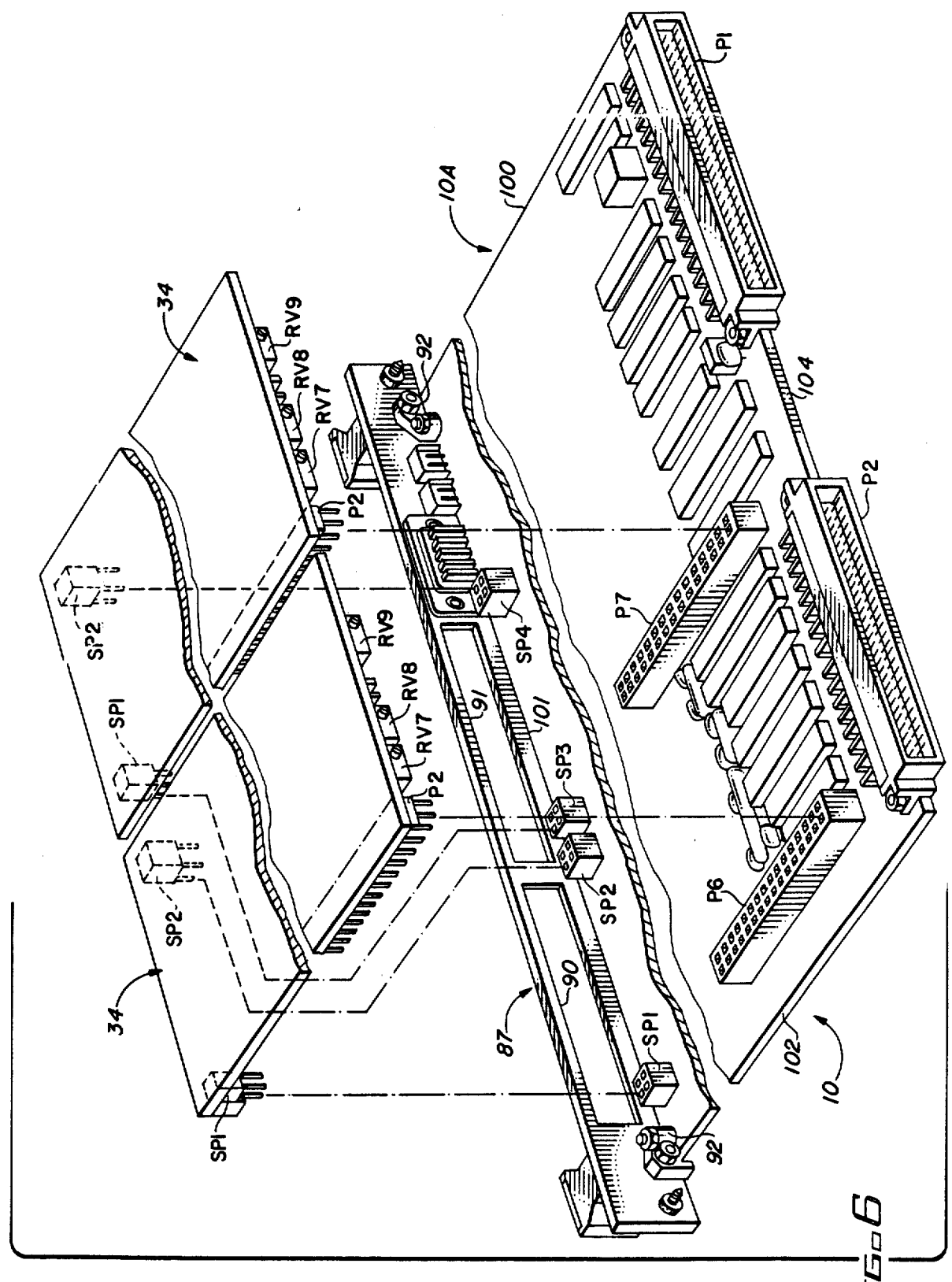

# PRINTED CIRCUIT BOARD TOPOGRAPHY FOR HIGH SPEED INTELLIGENT INDUSTRIAL CONTROLLER WITH MULTIPLE BOARDS LOCATED WITHIN A SINGLE SLOT

BACKGROUND OF THE INVENTION

The invention relates to an optimized topography of an intelligent industrial I/O controller system capable of being accommodated in a single slot space of a VMEbus back plane and capable of achieving I/O (input/output) speeds much higher than can be accomplished via the VMEbus for a large number of I/O channels using one double Eurocard PC (printed circuit) board structure.

Complex computing devices that include a powerful microprocessor such as a Motorola 68000, large amounts of electrically programmable read-only memory (EPROM), high speed static random access memory (SRAM), dynamic RAM (DRAM), interrupt handling circuitry, interrupt generating circuitry and a large number of channels of digital and/or analog I/O capability are sometimes referred to as "intelligent industrial I/O controllers", hereinafter simply "industrial I/O controllers". Such industrial I/O controllers are manufactured and marketed as multiple layer PC boards by various concerns. Users purchase the industrial I/O controllers and plug them into printed circuit board racks attached to a back plane with a standard bus thereon, such as the well-known VMEbus The more complex industrial I/O controllers of the type mentioned include two or more printed circuit boards which are plugged into the VMEbus back plane. A large number of customers who would buy an industrial I/O controller are faced with fixed space requirements. That is, the electronic portion of their product must fit into a predetermined small space.

At the present state-of-the-art, it is impossible to provide a system as complex as an intelligent industrial I/O controller on a single printed circuit board, such as a so-called double Eurocard, which is approximately 9 by 6 inches, because it is impossible to provide all of the integrated circuit (IC) functions required in a state-of-the-art industrial I/O controller on a single printed circuit board of the required size. Even when the most recent multilayer PC board technology and the most recently available LSIC (large scale integrated circuit) components are utilized, currently available industrial I/O controllers require at least two "slot spaces" of a bus back plane. A slot space for a VMEbus is approximately 0.8 inches thick.

FIG. 5A illustrates a typical configuration for an industrial I/O controller. Numeral 11 represents a so-called VMEbus. Numeral 71 designates a printed circuit board containing a CPU or microprocessor, such as a Motorola 68000 microprocessor, and also contains large amounts of DRAM, SRAM, and EPROM. A bidirectional bus 72 connects the CPU board 71 to the VMEbus 11. The industrial I/O controller includes a second PC board 73 that contains a large amount of I/O circuitry, such as multiplexers, sample and hold circuits, analog-to-digital converters, digital-to-analog converters, digital drivers, digital receivers, latches, input buffers, output buffers, and control logic circuitry. I/O board 73 is connected by bidirectional bus 74 to VMEbus 11. A plurality of input channels 76 and a plurality of output channels 75, which can be analog and/or digital channels, are connected to I/O board 73.

A shortcoming of the system described in FIG. 5A is that it requires two slots of the VMEbus back plane 11. Another problem is that communications between the CPU board 71 and the I/O board 73 must take place through the VMEbus 11. The VMEbus 11 does not permit data exchange rates in excess of 20 megabytes per second. Furthermore, whenever information is being exchanged between the CPU board 71 and the I/O board 73, the VMEbus 11 is unavailable to other printed circuit boards in the system, greatly slowing down the overall system operating speed.

Another possible approach to the problem is illustrated in FIG. 5B, wherein a local bus 77 connects the CPU board 71 and the I/O board 73, allowing much higher rates of data exchange between the CPU board 71 and the I/O board 73. This technique makes the VMEbus 11 available to the rest of the system during data exchanges between CPU board 71 and I/O board 73, and permits the data exchange between CPU board 71 and I/O board 73 to occur at much higher speeds than could be achieved by the system of FIG. 5A. Unfortunately, the physical size of I/O board 73 is such that it must occupy a "slot space" of the VME back plane 111 even though it is not actually plugged into the VMEbus because the slots of the VME back plane 11 are so close together that I/O board 73 blocks the VMEbus connector next to the one CPU board 71 is plugged into, so no other PC board can be plugged into that slot.

FIG. 5C shows what would be an ideal solution, wherein all of the functions of the industrial controller system, including the CPU circuitry 71A and all of the I/O circuitry 73A, are included on a single PC board 71A that requires only a single VMEbus slot and slot space. However, until now, it has been impossible to provide the system shown in FIG. 5C on a single PC board the size of a double Eurocard if it is to have the above-described capabilities.

Those skilled in the art know that the most severe constraints faced in designing a high density printed circuit board are the limited amount of area on the component side of the printed circuit board, the number of IC packages, other components, and connectors that must be located in that area, and the number of interconnections required between various leads of the integrated circuits, other components, and connectors that are to be plugged into or soldered onto the printed circuit board. The lengths of interconnection conductors must be minimized to reduce their capacitance and thereby increase operating speeds. Some of the numerous design constraints faced by a PC board system designer include specifications for minimum widths and spacings of copper conductors or "lines", the number of two-sided layers that can be economically laminated together to form a multiple layer printed circuit board, the maximum permissable lengths of certain individual conductors, the locations of edge connectors dictated by other system constraints, the fact that copper lines (sometimes referred to herein as "traces" or "lines") on the same surface cannot cross over one another, the need to minimize capacitive cross-coupling between certain conductors, and the locations and sizes of certain areas of the PC board which must free be free of copper, e.g., for bolts and nuts and a border along edges of the PC board.

After a block diagram of the system showing the required components, connectors, integrated circuits and their lead interconnections has been completed, computer aided design (CAD) systems are used to generate a diagram that is sometimes referred to as a "rat's nest", which shows all of the straight line connections between the leads of components, etc. of the block diagram. This rat's nest diagram is used to show the density of interconnections between particular integrated circuits. Although such rat's nest diagrams are very helpful, many hours of effort nevertheless usually are required for a system designer to select suitable LSI chips and locate them (often by trial and error) on the component side of the printed circuit board, because there is a very large number of possibilities for routing the various conductors and for placement of the various LSI chips. Selecting an optimum topography for a high density PC board often taxes the skill and ingenuity of even the most resourceful system designers and printed circuit board designers, and is far beyond the capability of the most sophisticated computer aided design programs yet available.

SUMMARY OF THE INVENTION

Accordingly, it is an object of the invention to provide an intelligent industrial I/O controller capable of processing I/O data transfers for a large number of serial I/O channels and/or analog channels at speeds comparable to the operating speed of a state-of-the-art 16 bit microprocessor while requiring only a single slot space of a main bus back plane, using a printed circuit board approximately the size of a double Eurocard printed circuit board.

It is another object of the invention to provide an intelligent industrial I/O controller of the type described that requires only half of the rack space and back plane space of any prior intelligent industrial I/O controller that could have approximately the same performance.

Briefly described, and in accordance with one embodiment thereof, the invention provides an intelligent input/output controller for connection to a VMEbus or like bus on a back plane. A topography is provided for a processor board and an analog I/O daughter board attached in close parallel relationship thereto so that the entire input/output controller assembly can be plugged into and occupy only a single slot space of the VMEbus back plane. In the described embodiment of the invention, the component side of the processor board includes a VMEbus connector, a first buffer circuit isolating the VMEbus from a first bus (a local VMEbus) to which a static RAM (SRAM) dual port data memory is connected, a second buffer circuit isolating the first bus from a second bus (the microprocessor bus) connected to a microprocessor, a dynamic RAM (DRAM), an electrically programmable ROM (EPROM), an asynchronous communications interface adaptor (ACIA), a programmable timer module (PTM), interrupt handling circuitry, interrupt generation circuitry, bus control circuitry, and optical isolation circuitry connected between the second bus and a third bus. One or two I/O daughter boards can be rigidly attached to the processor board by means of connectors on their component faces to mating connectors on the component side of the processor board so that the two daughter boards cover the lower two-thirds of the area of the component side of the board. "Tall" socketed components including the microprocessor, the EPROM, and the SRAM are located in the upper third of the area of the component side of the processor board. Only "low profile" components including the interrupt handler, the interrupt generator, the programmable timer module, and the DRAM and associated DRAM controller and DRAM decoding circuitry, the optical coupler circuitry, and optical coupler control circuitry are located in the area covered by the first and second daughter boards. Each of the daughter boards can be an analog I/O daughter board including an analog input multiplexer, an analog-to-digital converter, and a plurality of digital-to-analog converters. The outputs of the analog-to-digital converter are connected to the third bus. Each of the I/O daughter boards also can be a digital I/O daughter board including various output latches, input buffers, digital drivers, receiver circuits, and associated digital control circuitry. The combined topography of the processor board and the analog I/O daughter board makes it possible to provide the entire intelligent industrial I/O controller on what is in effect one "double Eurocard" PC board that occupies only a single slot space of the VMEbus back plane.

BRIEF DESCRIPTION OF THE DRAWINGS

FIG. 4 is a perspective view of a typical VMEbus back plane with the I/O industrial controller board of the present invention plugged in and two PIEbus I/O expansion boards plugged in.

FIGS. 5A–5C are block diagrams useful in explaining prior art structures and comparing them with the invention.

FIG. 6 is a partial perspective exploded view showing the processor board and two I/O daughter boards comprising the industrial I/O controller of the invention.

FIG. 6C is a left edge elevational view of the processor board of the industrial I/O controller of FIG. 6B.

FIG. 6D is a right edge elevational view of the processor board of FIG. 6B.

FIGS. 6I–6N are scale plan view diagrams of the plated through holes and copper conductor lines routing on six of the eight surfaces of the eight layer processor board of the industrial I/O controller.

DETAILED DESCRIPTION OF THE PREFERRED EMBODIMENT OF THE INVENTION

Figure 1:
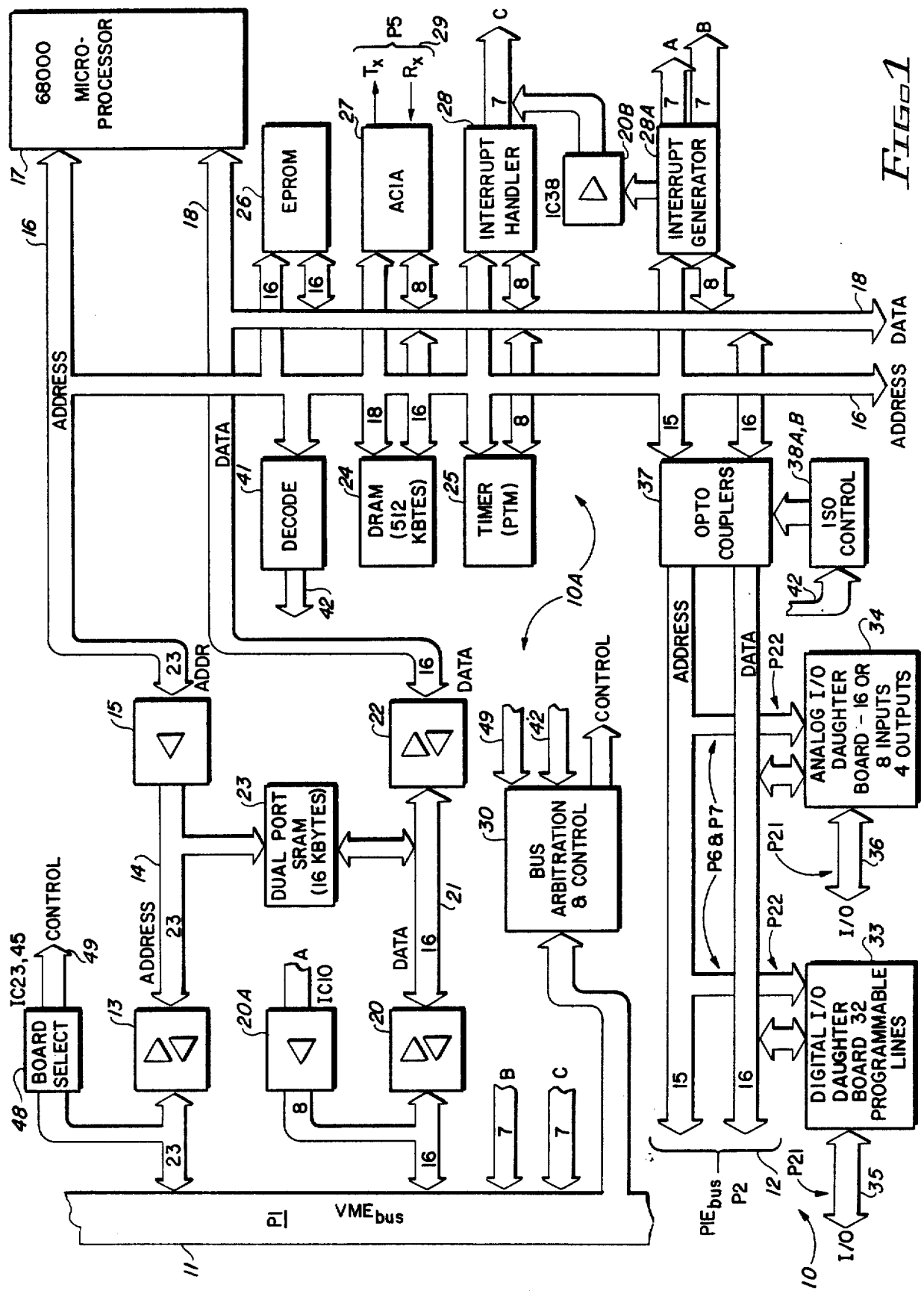
FIG. 1 is a block diagram of the industrial I/O controller of the present invention.

Referring to FIG. 1, a block diagram of the industrial I/O controller 10 of the present invention is shown. In accordance with the invention, all of the circuitry shown in FIG. 1 is implemented on a single "processor board" 10A (FIG. 6) that includes all of the circuitry shown except two I/O daughter boards 33 and 34. Each I/O daughter board can be a digital I/O daughter board such as 33, which has 32 programmable input and/or output lines 35 or an analog I/O daughter board 34 which can have 16 inputs and 4 outputs, collectively designated by numeral 36. Alternatively, one analog I/O board and one digital I/O board can be mounted on the processor board. In any case, the I/O daughter boards are mounted parallel and close to the processor board, with only about 10 millimeters clearance between the component surface of the daughter boards and the processor board. Only a single slot space of the VMEbus back plane 11 is required, so adjacent VMEbus back plane slots on either side of the one into which the industrial I/O controller 10 is inserted remain available for receiving other PC boards.

The topography of the present invention is what makes it possible to get the computing power of the industrial I/O controller in a single VMEbus slot space.

I/O controller 10 includes a connector P1, which is an inverse Euroconnector, by means of which the main board, which is a double Eurocard printed circuit board, is inserted into a slot of VMEbus 11. Twenty-three bidirectional transceivers 13 connect the conductors of connector P1 to the 23 address conductors 14. The 23 address conductors 14 are connected by means of drivers 15 to the 23 address outputs of microprocessor 17, which is a Motorola 68000 16 bit microprocessor. 16 data conductors of VMEbus 11 are connected by transceivers 20 to 16 data bus conductors 20, which are connected by 16 transceivers 22 to the 16 bidirectional data bus terminals of microprocessor 17. A 16 kilobyte dual port static RAM (SRAM) 23 has its address inputs connected to address conductors 14 and its data terminals connected to data bus conductors 16.

Eight of the VMEbus data conductors are coupled by a buffer 20A and conductors A to eight outputs of an interrupt generator 28A. A plurality of the VMEbus address lines are coupled by a board select circuit 48 to a plurality of corresponding control lines 49. Seven of the VMEbus conductors B are connected to seven corresponding outputs of interrupt generator 28A. Seven of the VMEbus conductors C are connected to seven corresponding conductors of interrupt handler 28 and buffer 20B. A plurality Of the VMEbus lines are connected to bus controller 30. Bus controller 30 generates a plurality of control signals that are distributed to various circuits of the processor board.

An address decode circuit 41 is connected to address bus 16 and produces various control signals 42 that are distributed throughout the processor board 10A, including bus controller 30. 512 kilobytes of "local" dynamic random access memory (DRAM) in block 24, which has its data terminals connected to microprocessor data bus 18. The address inputs of local DRAM 24 are connected to 18 of the conductors of microprocessor address bus 16. An electrically programmable read-only memory (EPROM) 26 containing 128 kilobytes has its data terminals connected to microprocessor data bus 18, and has its address inputs connected to microprocessor address bus 16. A programmable timer module 25 is connected to three conductors of microprocessor address bus 16 and also is connected to microprocessor data bus 18. An asynchronous communications interface adaptor (ACIA) 27 has its two address inputs connected to microprocessor address bus 16 and its eight data bus terminals connected to data bus 18. The transmit (Tx) and receive (Rx) conductors 29 of ACIA 27 are connected to an RS232 port, designated P5. An interrupt handler circuit 28 has its eight data terminals connected to data bus 18 and its three address terminals connected to address bus 16. Interrupt generator circuit 28A has its eight data terminals connected to data bus 18 and its one address terminal connected to address bus 16. Some of the outputs of interrupt generator 28A are connected to inputs of buffer 20B. A plurality of optoelectronic couplers in block 37 connect 15 of the 23 microprocessor address bus conductors 16 to 15 PIEbus conductors designated by reference numeral 31. A plurality of the optoelectronic couplers in block 37 also connect the 16 data bus conductors 18 to 16 local PIEbus data conductors 32. The PIEbus conductors collectively designated by reference numeral 12 are connected to a port designated as P2 to provide an expansion bus which is electrically isolated from the microprocessor address bus 16 and the microprocessor data bus 18. All input/output communication with the industrial I/O controller passes through the PIEbus data bus conductors 32. Isolation control circuitry 38 is connected to optical coupler 37 by a plurality of control conductors 40 in response to signals from the address bus 16 and data bus 18 and also in response to signals from the address bus 31.

Digital I/O daughter board 33 and analog I/O daughter board 34 are connected to the PIEbus address bus conductors 31 and PIEbus data bus conductors 32 by means of two ports designated P6 and P7, respectively, on the processor board 10A. The external I/O terminals of each of digital I/O daughter board 34 and analog I/O daughter board 33 are designated by P21, and the connector of each which mates with connector P6 and P7 of processor board 10A is designated by P22.

Figure 2:
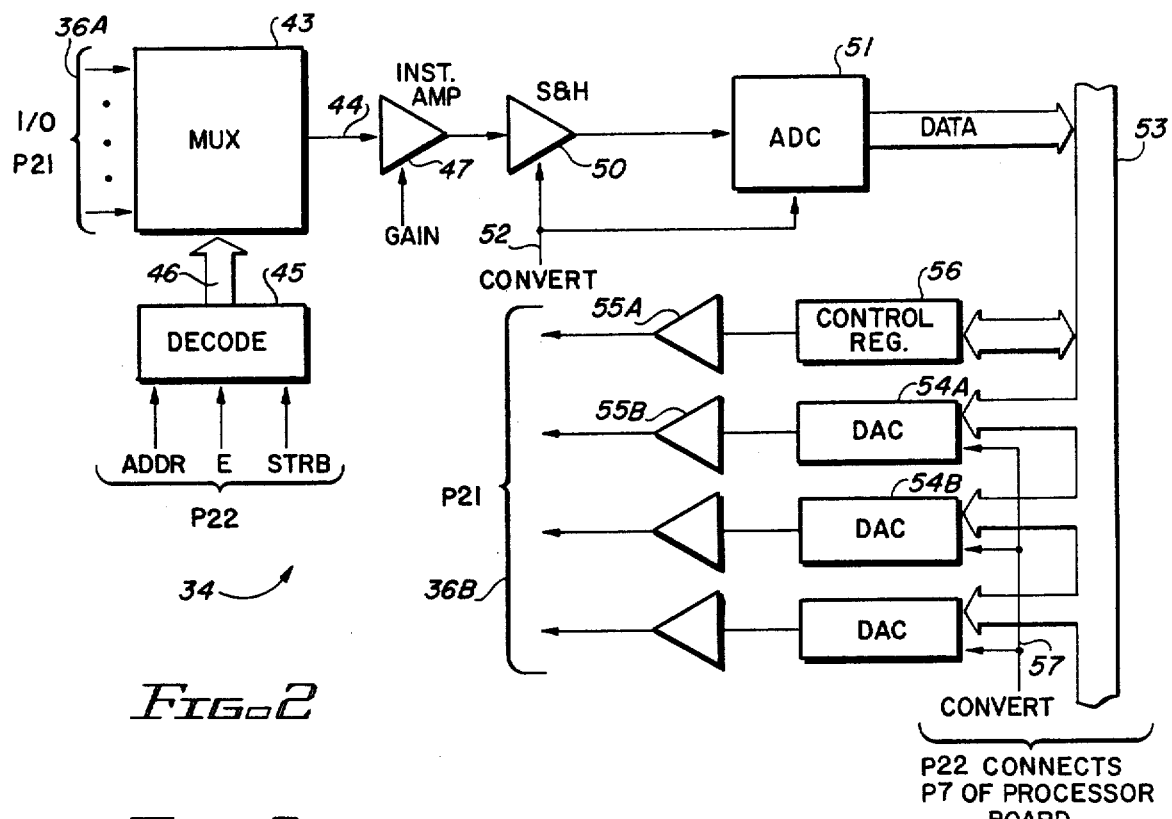
FIG. 2 is a detail block diagram of the analog I/O daughter board 34 of FIG. 1.

Referring next to FIG. 2, analog I/O daughter board 34 includes an input multiplexer 43 which is connected by 16 conductors 36A to its P21 connector. One of conductors 36A is selected by conductors 46 produced by decode circuit 45. Decode circuit 45 decodes the addresses of the PIEbus conductors 31, which are connected to connector P22.

The output of multiplexer 43 is connected by conductor 44 to the input of an instrumentation amplifier 47, the gain of which is controlled by a GAIN input. The output of isolation amplifier 47 is connected to the input of a sample and hold circuit 50. The output of sample and hold 50 is connected to the analog input of a 12 bit analog-to-digital converter 51. The data outputs 53 of analog-to-digital converter 51 are connected to the PIEbus data bus 53, which is connected to connector P22. The data signals 53 are connected to the data inputs of four digital-to-analog converters 54A–54D, the analog outputs of which are connected to the inputs of four buffer driver circuits 55A–55D and to conductors 36B of a connector P21. A signal CONVERT is applied by conductor 52 to the convert input of analog-to-digital converter 51 and the sample input of sample and hold circuit 50. The same convert signal is applied to the conversion input of digital-to-analog converters 54A-54D by conductor 57, and is produced by the programmable timer module 25 or a suitable externally supplied source via the optical couplers 37.

Figure 3:
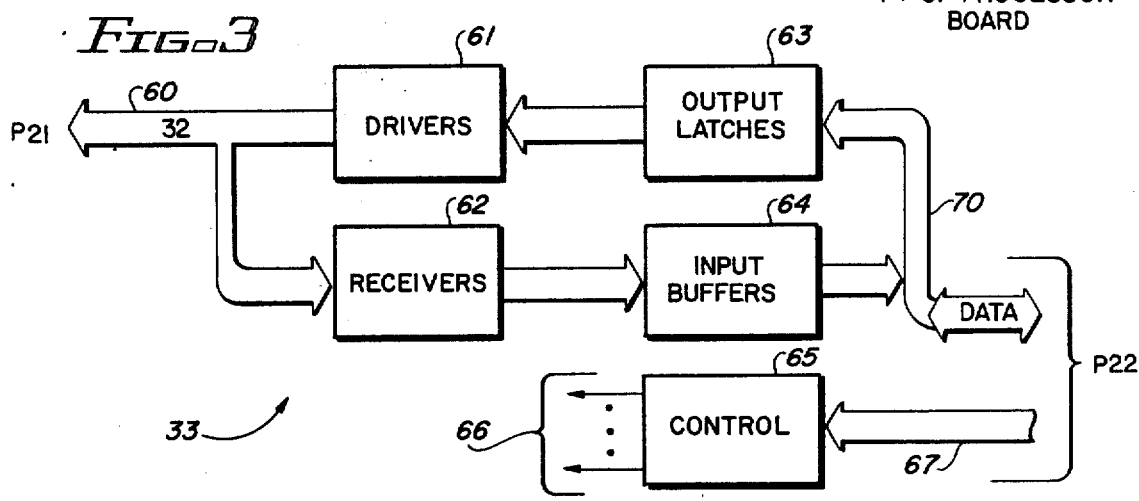
FIG. 3 is a block diagram of the digital I/O daughter board 33 of FIG. 1.
Figure 4:
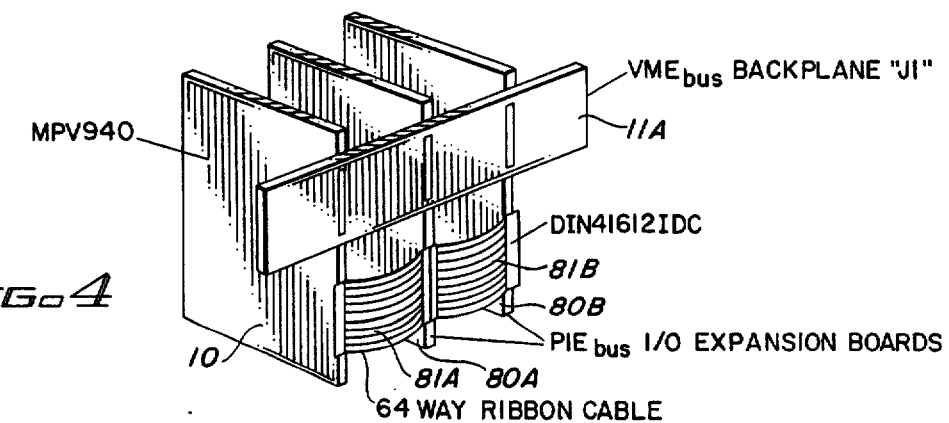

FIG. 3 shows a block diagram of the digital I/O daughter board 33. It contains 32 digital I/O conductors designated by reference numeral 60 connected to connector P21. The 32 digital I/O conductors are connected to the outputs of 32 corresponding drivers 61 and the inputs of 32 corresponding receiver circuits 62. The inputs of driver circuit 61 are connected to the outputs of 32 output latch circuit 63. The inputs of latches 63 are connected to data bus conductors 70, which are connected to port P22. The data bus conductors 70 also are connected to the outputs of input buffer 64, the inputs of which are connected to the outputs of the receiver circuits 62. A control circuit 65 has its inputs connected to various address lines and various control strobe signals indicated by conductor 67 to generate a plurality of control signals 66. Conductor 67 and conductors 70 are connected to connector P22.

FIG. 6 shows a perspective exploded view of the industrial controller 10, which in the illustrated embodiment includes processor board 10A with two analog I/O daughter boards 34, each designated by reference numeral 34, which can be plugged into processor board 10A so that the entire unit is sufficiently thin (0.8 inches) that it occupies only a single slot space in the VMEbus back plane and rack into which it is plugged. Processor board 10A includes on the upper portion of its right edge 104 a VMEbus conductor P1 and an expansion bus connector P2 attached to the lower portion of right edge 104. Along left edge 101 a front panel mounting plate 89 having therein two windows 90 and 91 is rigidly attached by means of two fastening mechanisms 92 to processor board 10A. Mounting plate 89 is used for the purpose of mounting the RS232 connector (P5 in FIG. 1), air flow improvement and reduction of EMI.

Various integrated circuits, resistor networks, discrete capacitors, etc., various connectors, and support posts including connectors P6 and P7 and support posts SP1, SP2, SP3, and SP4 are mounted on the upper "component side" of processor board 10A.

The lower surfaces of I/O analog daughter boards 34 as shown in FIG. 6 are the component sides thereof. Each analog I/O daughter board includes a connector P22, the male leads of which are received by female conductors of either connector P6 or P7 of processor board 10A. Each I/O analog daughter board 34 also includes two support post connectors SP1 and SP2, the prongs of which are received by matching receptacles of support post connectors SP1 and SP2 or SP3 and SP4, respectively, of processor board 10A. When connector P2 of daughter board 34 and support post connectors SP1 and SP2 of daughter board 34 are completely plugged into connectors P6, SP1, and SP2, respectively, of processor board 10A, the separation of the lower surface of daughter board 34 on the upper surface of processor 10A is only 10 millimeters. (The support posts can be replaced by spaced with studs by means of which the daughter boards are bolted to the processor board 10A.) Only "low profile" components are provided on the component face of processor board 10A in the areas beneath the two daughter boards.

Figure 6A:
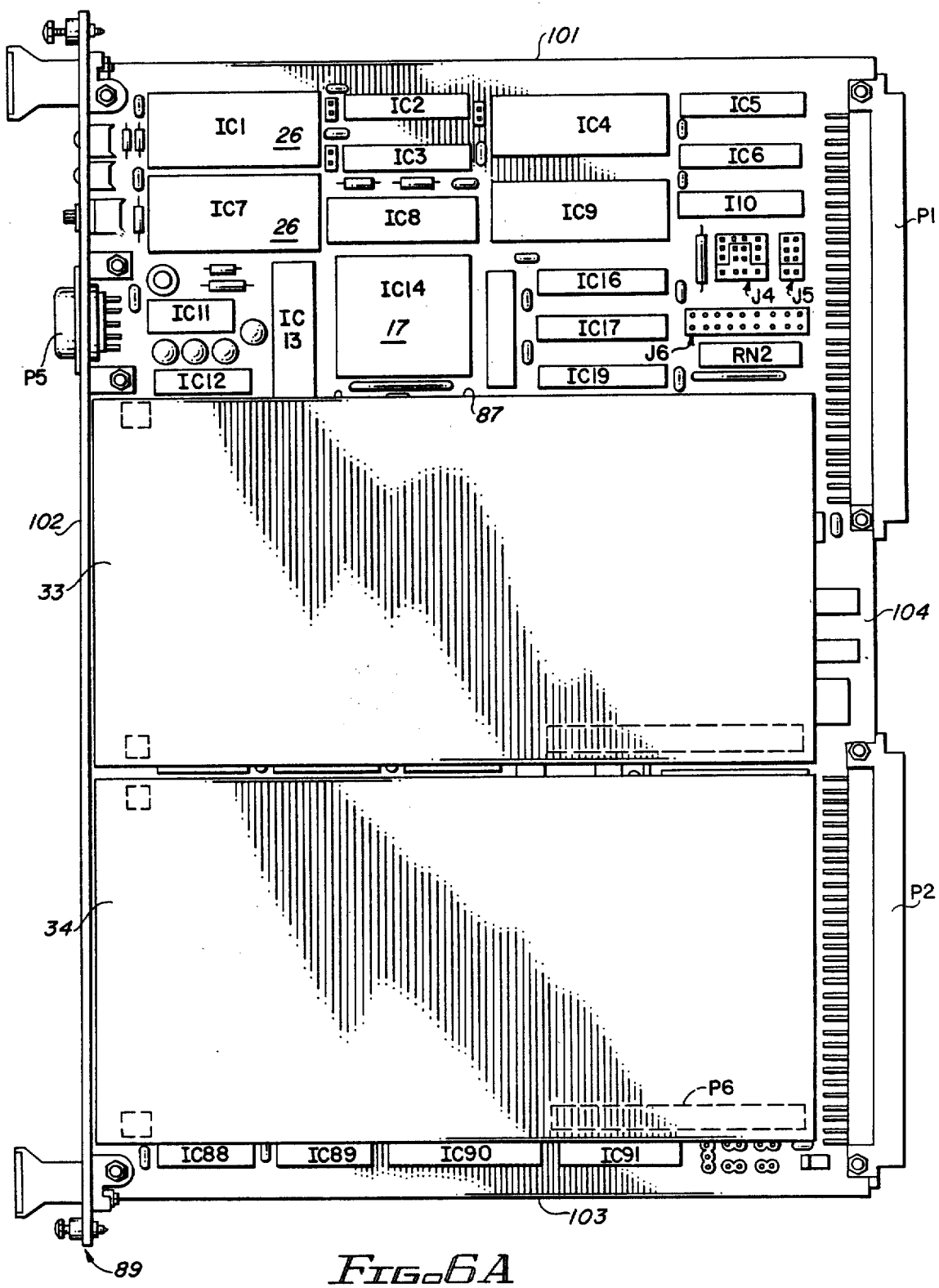
FIG. 6A is a plan view of the industrial controller board of the invention with two I/O daughter boards plugged into the processor board.
Figure 6B:
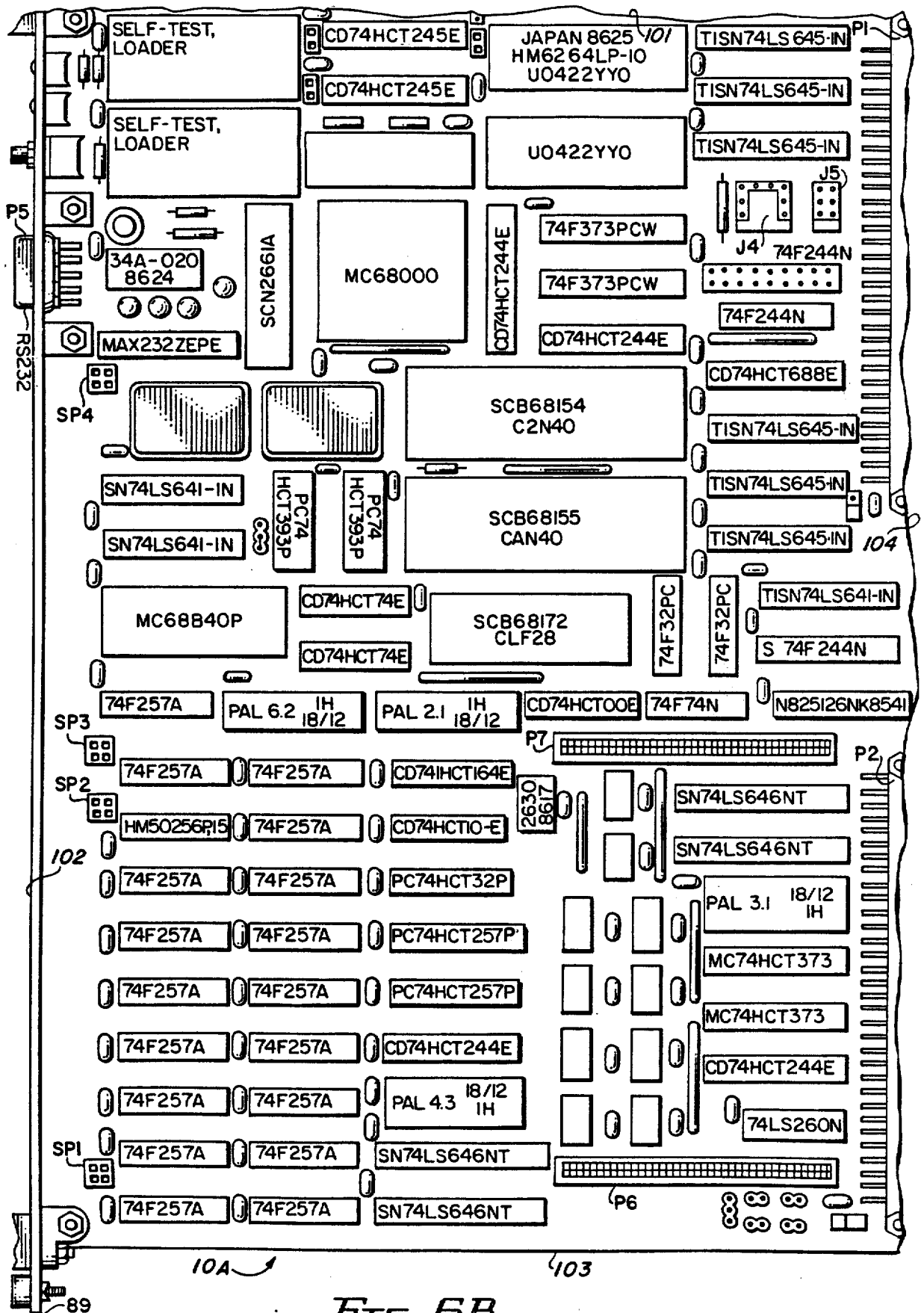
FIG. 6B is a plan view of the component side of the processor board of the industrial I/O controller.

FIG. 6A shows a top plan view of industrial I/O controller 10 with two daughter boards 33 and 34 plugged in. FIG. 6B shows a plan view of the entire component surface of processor board 10A. The Table 1 below indicates the type of commercially available integrated circuit components for each of the integrated circuit components of processor board 10A.

TABLE 1

| IC # | PART # |
|---|---|
| IC1 | 27256 32Kx8 EPROM |
| IC2 | 74245 bidirectional transceiver |
| IC3 | 74245 bidirectional transceiver |
| IC4,9 | 8Kx8 static RAM |
| IC5 | 74645 high current drive bidirectional transceiver |
| IC6 | 74645 high current drive bidirectional transceiver |
| IC7 | 27256 32Kx8 EPROM |
| IC8 | 20L8 PAL |
| IC9 | 8Kx8 static RAM |
| IC10 | 74645 |
| IC11 | Triple 20 nanosecond delay line |
| IC12 | MAX 232 RS232 transceiver |
| IC13 | 2661A ACIA |
| IC14 | 68000 MPU |
| IC15 | 74244 octal buffer |
| IC16 | 74373 octal D latch |
| IC17 | 74373 octal D latch |
| IC18 | 74244 |
| IC19 | 74244 |
| IC20 | 4.91520 MHz crystal oscillator |
| IC21 | 20.00 MHz |
| IC22 | 68154 interrupt generator |
| IC23 | 74688 octal comparator |
| IC24 | 74645 |
| IC25 | 74641 open collector bidirectional transceiver |
| IC26 | 74641 open collector bidirectional transceiver |
| IC27 | 74393 dual 4 bit ripple counter |
| IC28 | 74393 dual 4 bit ripple counter |
| IC29 | 68155 interrupt handler |
| IC30 | 74645 |
| IC31 | 74645 |
| IC32 | 6840 programmable timer |
| IC33 | 7474 dual D flip-flop |
| IC34 | 7404 hex inverters |
| IC35 | 68172 bus controller |
| IC36 | 7432 quad 2 input OR |
| IC37 | 7432 quad 2 input OR |
| IC38 | 74641 |
| IC39 | 74244 |
| IC40 | 74257 quad 2 input multiplexers |
| IC41 | 16R4 PAL |
| IC42 | 16L8 PAL |
| IC43 | 7400 quad 2 inut NAND |
| IC44 | 7474 |
| IC45 | 256x bipolar PROM |
| IC46 | 74257 |
| IC47 | 74257 |
| IC48 | 74164 8 bit shift register |
| IC49 | HCP62630 dual opto coupler |
| IC50 | HCP62630 dual opto coupler |
| IC51 | 74646 octal bidirectional transceiver |
| IC52 | 256Kx1 dynamic RAM |
| IC53 | 256Kx1 dynamic RAM |
| IC54 | 7410 triple 3 input NAND |
| IC55 | HCPL 2630 |
| IC56 | 74646 |
| IC57 | 256Kx1 DRAM |
| IC58 | 256Kx1 DRAM |
| IC59 | 7432 |
| IC60 | 16RP8 PAL |
| IC61 | 256Kx1 DRAM |
| IC62 | 256Kx1 DRAM |
| IC63 | 74257 |
| IC64 | HCPL 2630 |
| IC65 | HCPL 2630 |
| IC66 | 74373 |
| IC67 | 256Kx1 DRAM |
| IC68 | 256Kx1 DRAM |
| IC69 | 74257 |

TABLE 1-continued

| IC # | PART # |
|---|---|
| IC70 | HCPL 2630 |
| IC71 | HCPL 2630 |
| IC72 | 74373 |
| IC73 | 256Kx1 DRAM |
| IC74 | 256Kx1 DRAM |
| IC75 | 74244 |
| IC76 | HCPL 2630 |
| IC77 | HCPL 2630 |
| IC78 | 74244 |
| IC79 | 256Kx1 DRAM |
| IC80 | 256Kx1 DRAM |
| IC81 | 16R8 PAL |
| IC82 | HCPL 2630 |
| IC83 | HCPL 2630 |
| IC84 | 74260 dual 5 input NOR |
| IC85 | 256Kx1 DRAM |
| IC86 | 256Kx1 DRAM |
| IC87 | 74646 |
| IC88 | 256Kx1 DRAM |
| IC89 | 256Kx1 DRAM |
| IC90 | 74646 |
| IC91 | open |

Figure 6E:
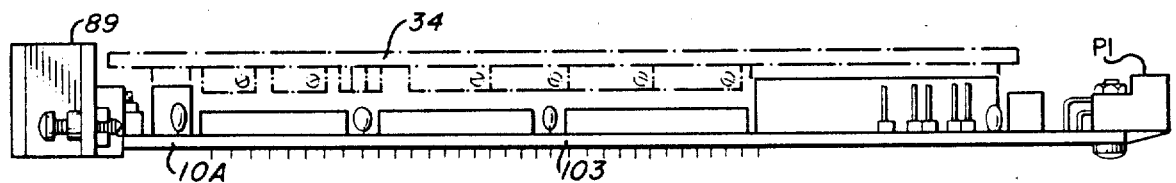
FIG. 6E is a lower edge elevational view of FIG. 6B.
Figure 6F:
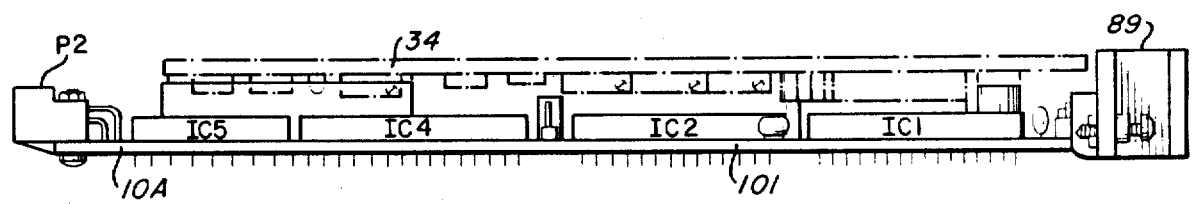
FIG. 6F is a lower edge elevational view of FIG. 6B.
Figure 7B:
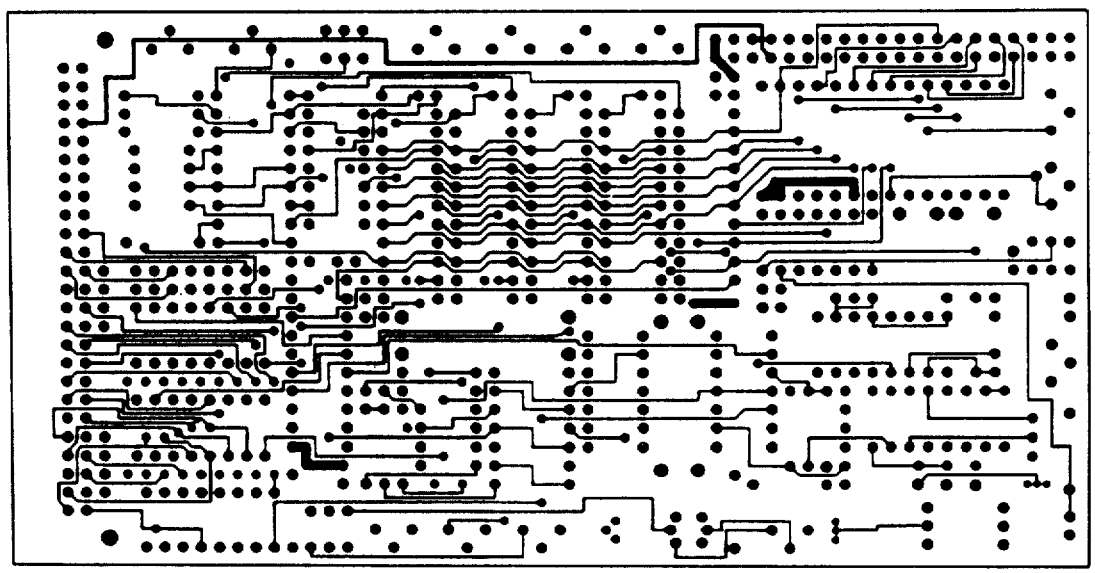
FIGS. 7B–7D are scale plan view diagrams showing the plated hole locations and copper line routing of the analog I/O daughter board.

FIGS. 6C and 6D show the left elevational and right elevational edge views of processor board 10A. The dashed lines indicate the location of plugged-in analog boards 34, showing that the thickness of the complete industrial I/O controller with both daughter boards properly plugged in is less than the height of the mounting plate 89. FIGS. 6E and 6F show lower and upper edge elevational views of processor board 10A. Again, dashed lines 34 indicate the position of the plugged-in daughter I/O boards 34.

Figure 6G:
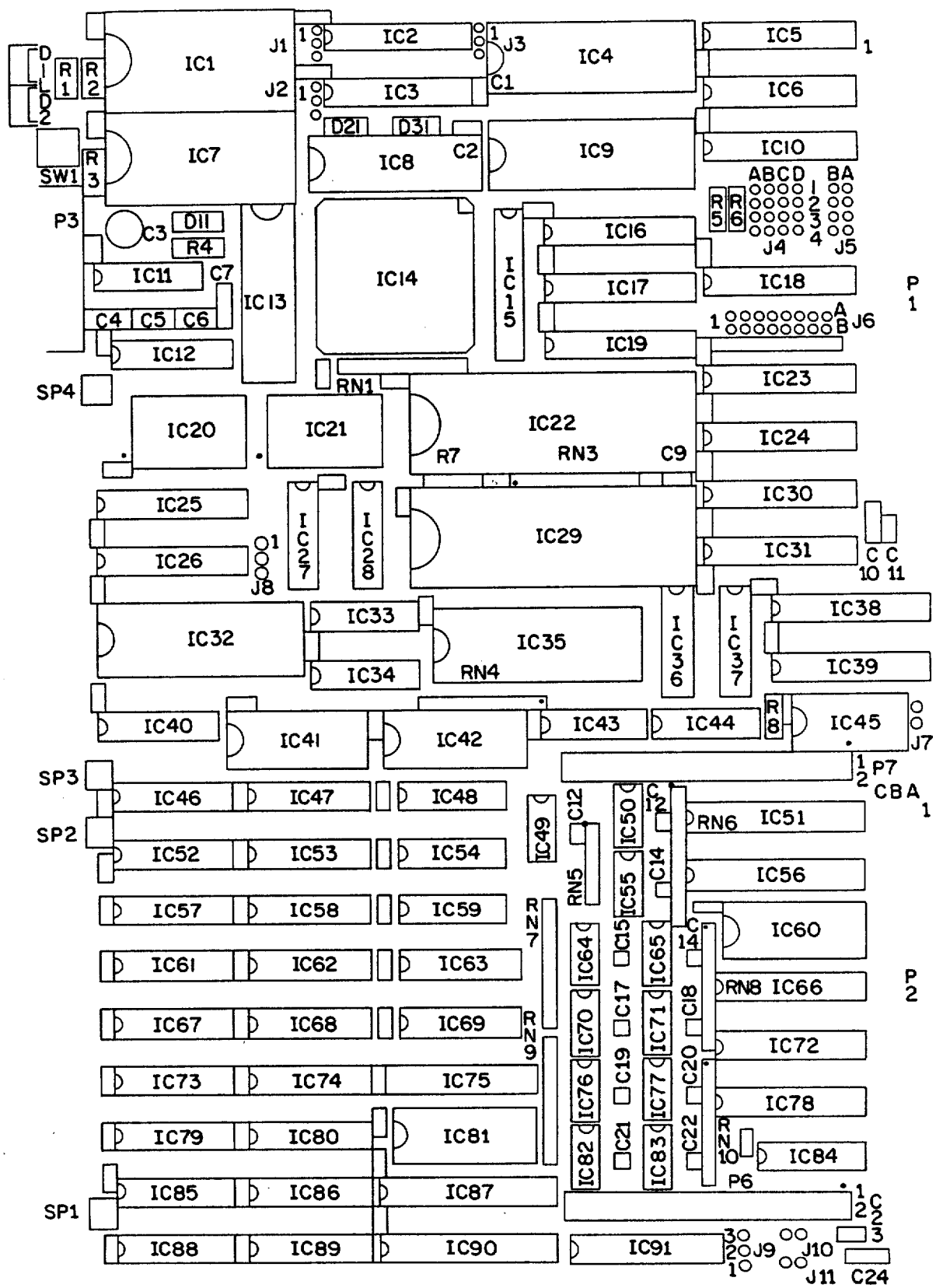
FIG. 6G is an assembly diagram of the component side of the processor board of the industrial I/O controller.

FIG. 6G is a scale assembly drawing showing positions of the all of the components and connectors of the processor board 10A on the component side thereof. The components include integrated circuits IC1-IC91, resistors R1-R8, capacitors C1-C24, jumper connectors J1-J11, connectors P1, P2, P5, P6, and P7 and support connectors SP1-SP4. Support posts SP1 support the corners of the two daughter boards that are plugged into the main board.

Figure 6H:
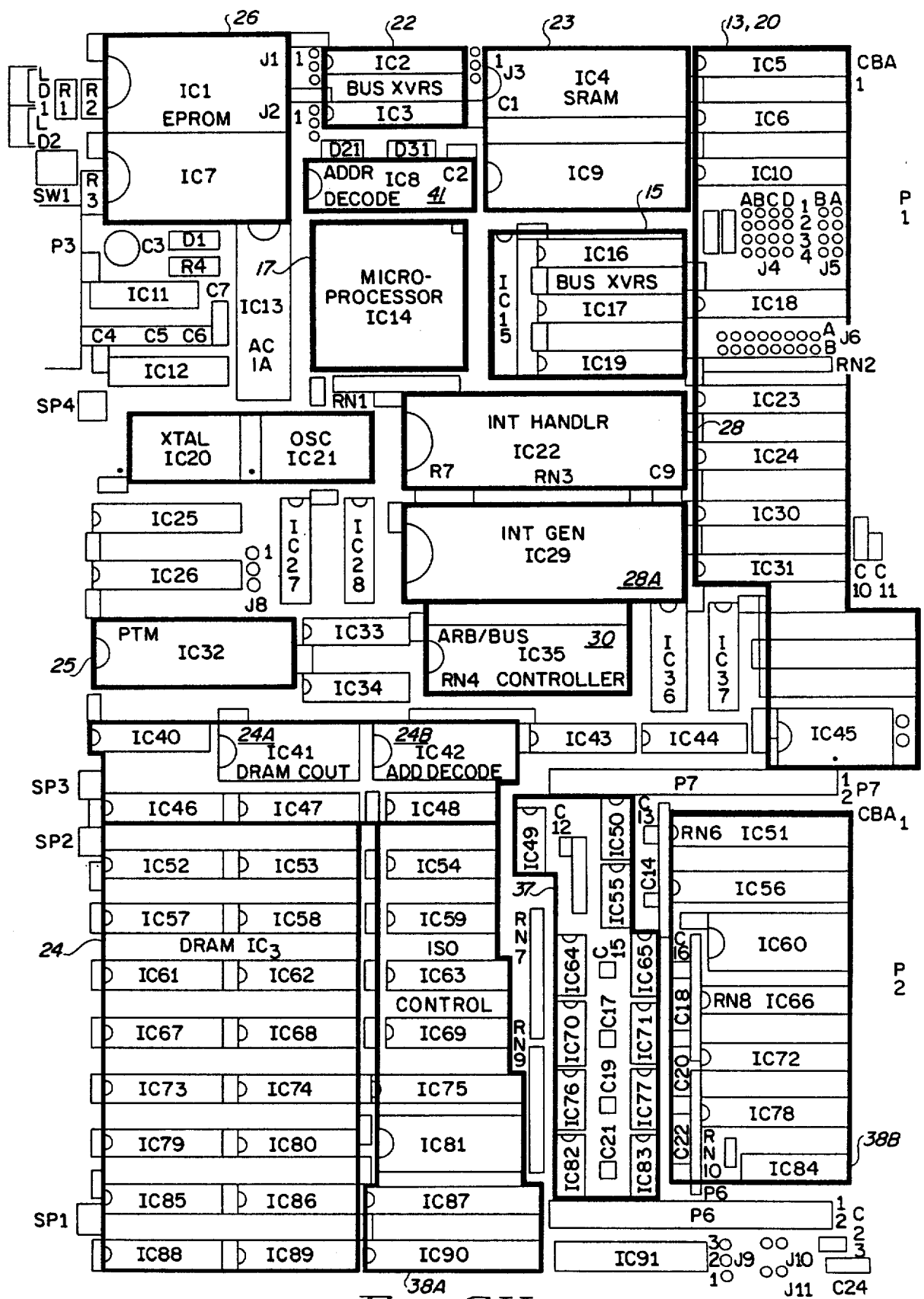
FIG. 6H is a diagram identical to FIG. 6F and further including outlines of the major circuit sections thereon in accordance with FIG. 1.
Figure 61:
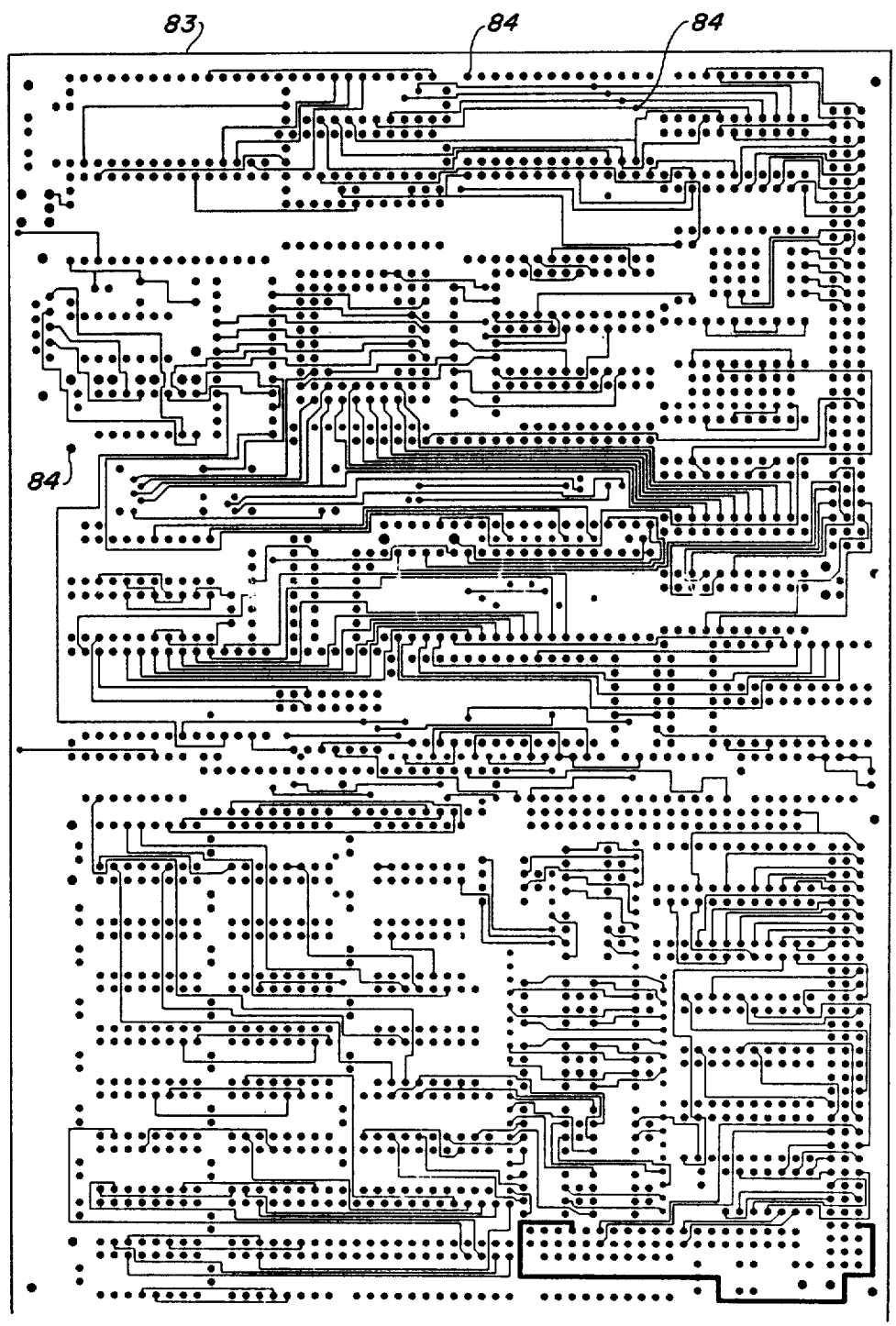
Figure 6J:
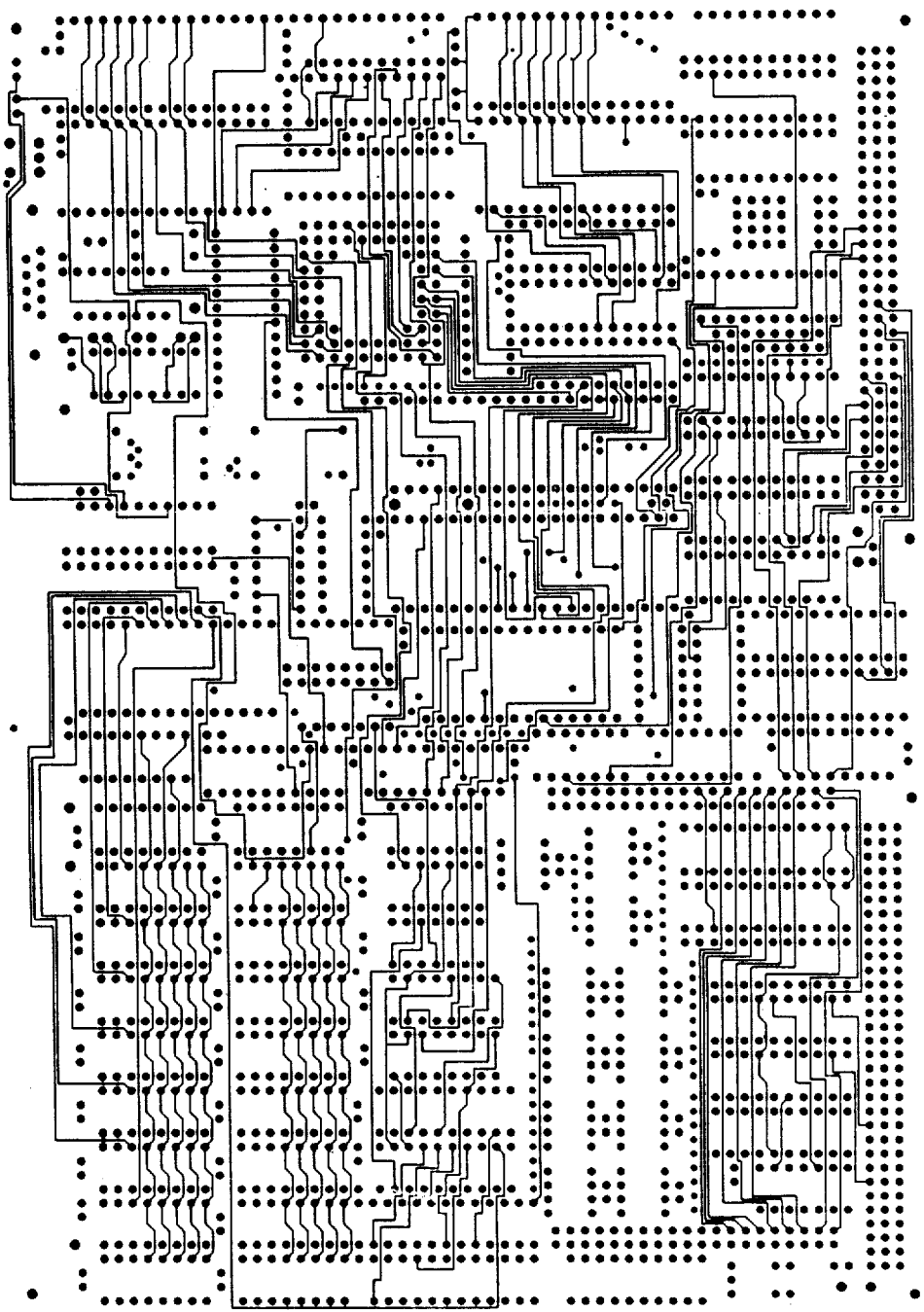
Figure 6K:
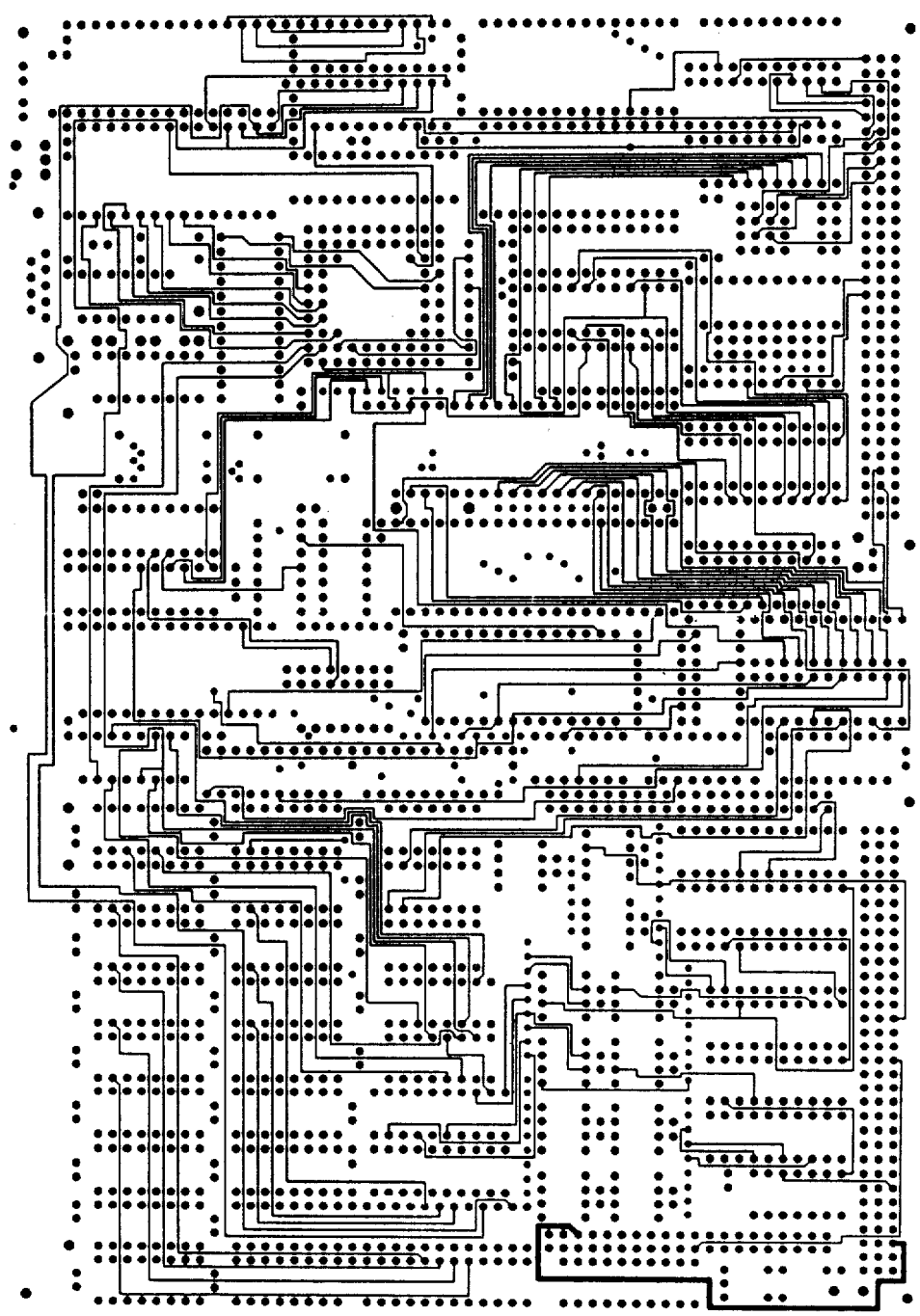
Figure 6L:
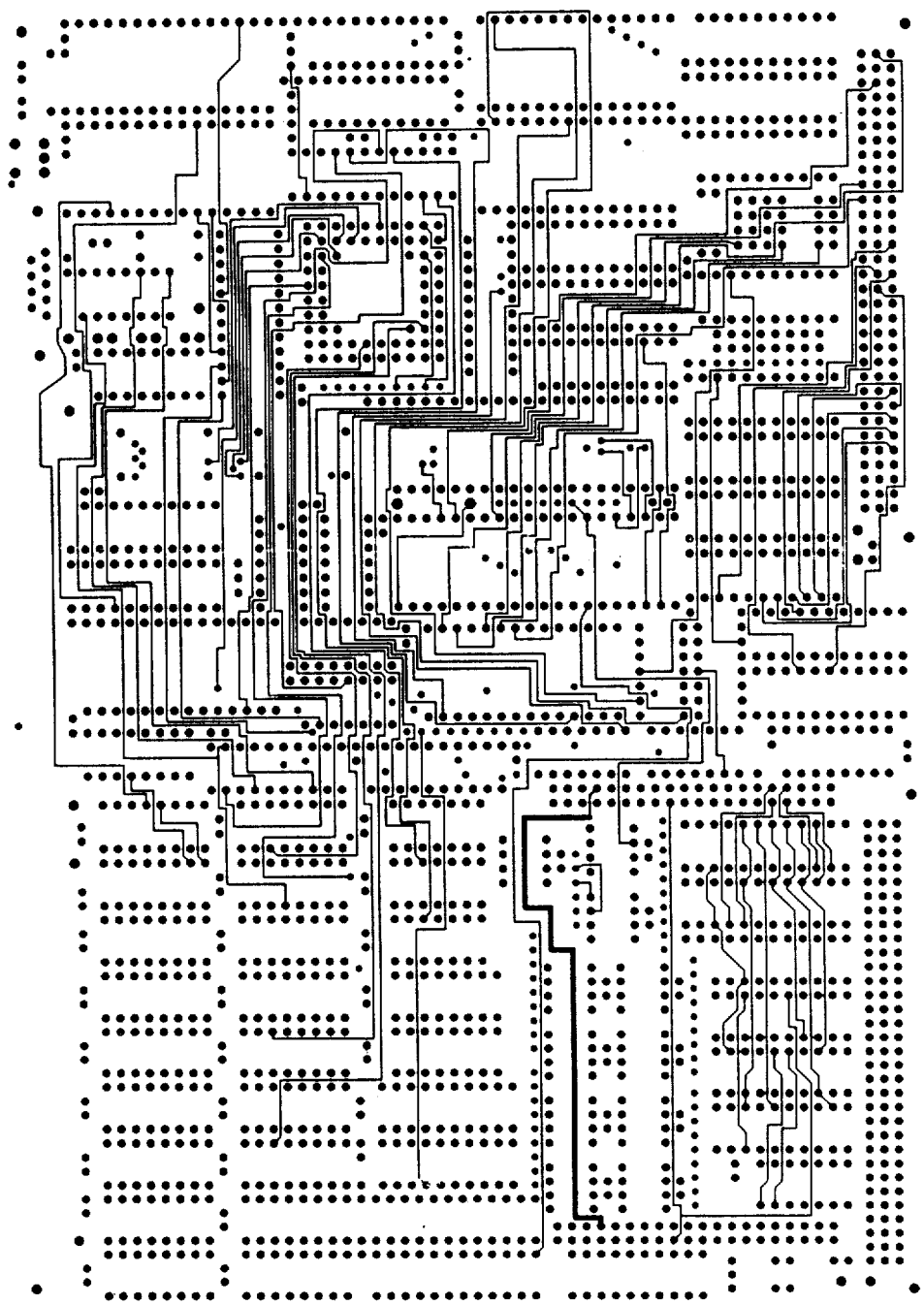
Figure 6M:
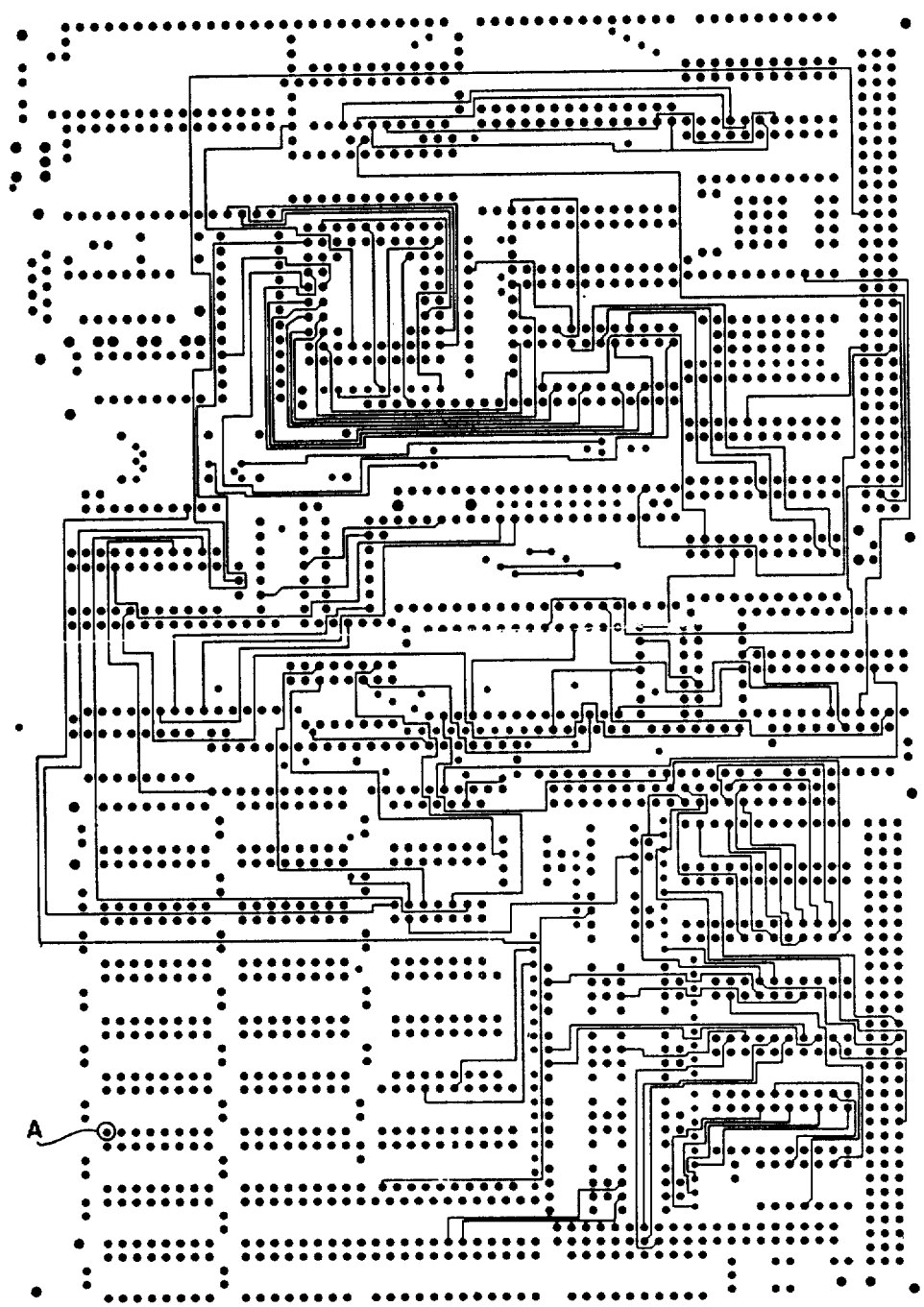
Figure 6N:
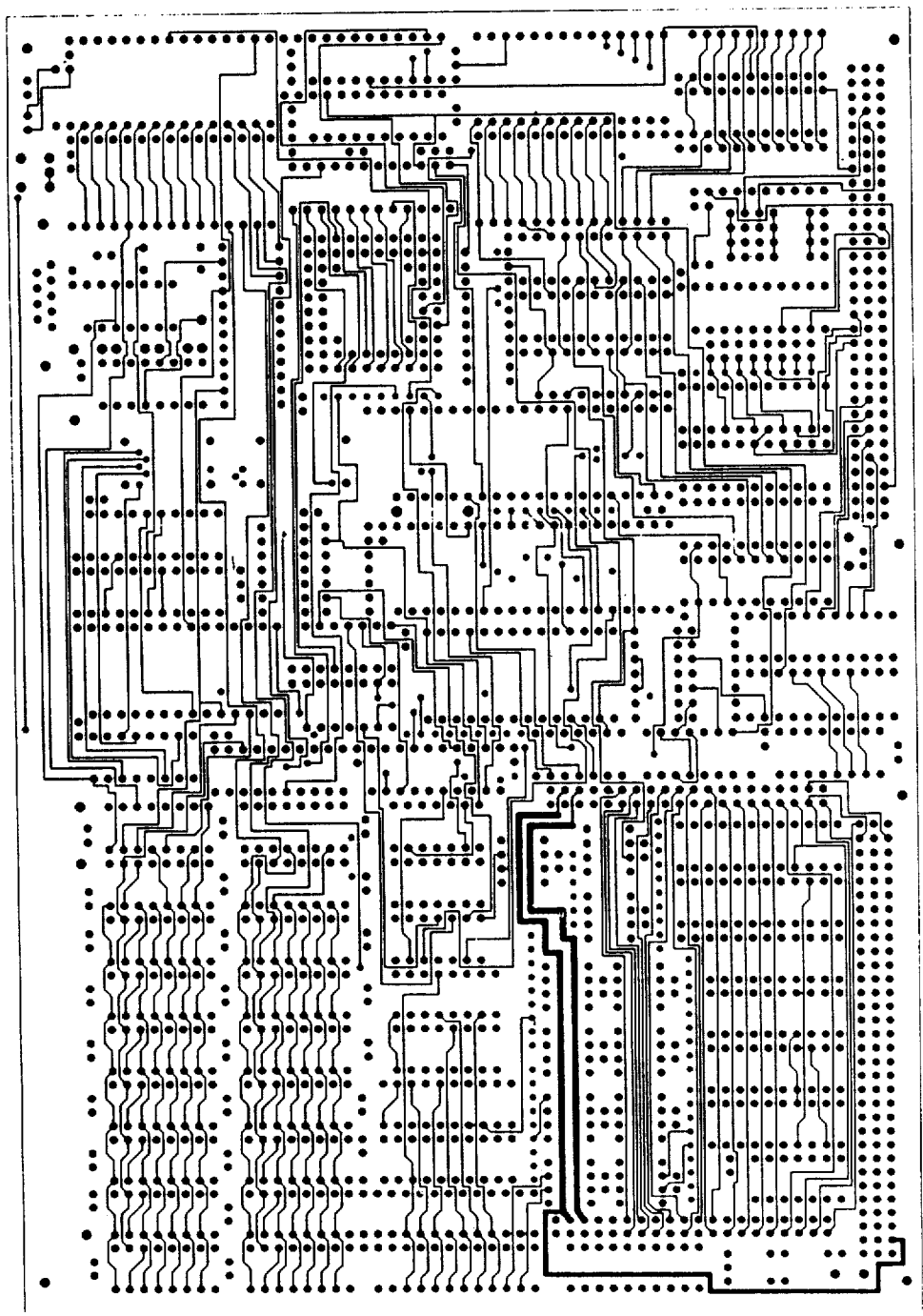

FIG. 6H is identical to FIG. 6G, except that the major blocks of circuitry, including those identified in the block diagram of FIG. 1, have been identified and heavily outlined.

A main aspect of the invention is the placement of the major blocks identified in FIG. 6A on the processor board 10A, combined with the positioning of the daughter board connectors and daughter boards when they are plugged into processor board 10A, and the partitioning of components among processor board 10A and the I/O daughter boards 33 and 34 to provide a "single-board" industrial I/O controller that requires only a single VMEbus back plane slot and occupies only the volume of a single slot space.

Before describing the placement of the major blocks of circuitry in FIG. 6H and the main considerations and trade-offs involved in arriving at that placement, it will be helpful to first briefly describe the different layers of the eight layer processor board 10A and the basic process for making it. The precise routing of conductors on each side of the eight interconnect layers are not necessary to understanding the present invention, but six of the eight layers showing the locations of all plated holes and all copper interconnections are included (as FIGS. 6I-6N) simply for completeness of disclosure. The other two layers not shown include a "five volt plane" and a "ground plane", each of which simply constitutes a copper layer that is continuous except for circular regions surrounding the through-plated holes that are not connected to +5 volts. The ground plane perform an identical function to the 5 volt plane for 0 volts. Also, a "solder mask" layer, which is used for screen printing a solder resist pattern on the surfaces of the completed PC board is not shown. These layers have been omitted because they contain no specific information about the interconnections of the integrated circuits and other components that make up the circuitry of the processor board.

The plated hole pattern is identical for each of layers 6I-6N, which are shown to scale. Each copper line extends between at least two plated holes. As those skilled in the art know, each such plated hole extends through all eight layers of the eight layer multilayer printed circuit board to facilitate interconnections between copper lines on any of the various layers. Since copper lines cannot cross one another on the same layer, a particular copper line on one layer must be connected via a plated hole to a copper line on another layer in order to provide a "crossover". The patterns on the two surfaces of each of the four "layers" of the PC board are etched using conventional technology. Dielectric coatings are provided and the four thin sheets are laminated together (in any order) to provide the final "eight layer" PC board. The described techniques are entirely conventional. In FIG. 6I, reference numeral 83 designates the edge of processor board 10A. Reference numerals 84 in FIG. 6I designate locations of various plated holes. Each plated hole is drilled through the center of one of the circular spots 84, so that each drilled hole is surrounded by a conductive ring. If a copper line touches the conductive ring, the plated hole is electrically connected to that conductor and also to any lead of a socket, integrated circuit, connector, or other component extending through and soldered to that plated hole.

Referring to FIG. 6H, the VMEbus interface circuitry 13, 20, including IC5, IC6, IC10, IC18, IC23, IC24, IC30, IC31, IC38, IC39, and IC45 and bus jumper connectors J4, J5, and J6 are located along the upper right-hand side of processor board 10A, adjacent to VMEbus connector P1. The location of connector P1 (and also connector P2) is determined by the well-known VMEbus specification, which also specifies the mechanical configuration of the entire rack supporting all of the PC boards that are plugged into the VMEbus back plane.

The dual port static RAM (SRAM) 23, including IC4 and IC9, is located along the upper edge of the processor board 10A to the left of the VMEbus interface circuitry 13, 20. The data bus part 22 of bus transceiver circuitry 15, 22 including IC2 and IC3, is located along the upper edge of processor board 10A immediately to the left of SRAM 23. Address decode circuitry 41 is located immediately below bus transceivers 15 to effectuate addressing the SRAM and EPROM and to generate various enable signals use throughout the processor board. EPROM 26 is located in the upper left-hand corner of the component side of processor board 10A and includes IC1 and IC7.

The address part 15 of bus transceiver circuitry 15, 22, including IC15, IC16, IC17, and IC19, is located immediately below SRAM 23 and to the left of VMEbus interface circuitry 13, 20, and immediately to the left of bus transceiver circuitry 13, 20. Microprocessor 17, which includes IC14, is located immediately below address decode circuitry 41. The space immediately to the left of microprocessor 17 includes the ACIA, RS232 line drivers, and other "tall" components, including IC11 which includes a tall delay line driver which is associated with DRAM control circuitry of IC41.

Interrupt circuitry 28 and 28A are located immediately below block 15B and microprocessor 17 and to the left of the lower portion of VMEbus interface circuitry 13, 20. Interrupt handler 28 is included in IC22, and interrupt generator 28A circuit is included in IC29. An arbitration/bus control circuit is contained in IC35. Interrupt handler 28, interrupt generator 28A, and bus control circuit 30 are coupled directly to the VMEbus, and therefore should be close to the VMEbus buffer circuitry 13, 10. A crystal oscillator including IC20 and IC21 is located immediately to the left of IC22 and generally below EPROM 26. A programmable timer module 25 included is included in IC32, which is located along the left edge of processor board 10A, to the left of arbitration/bus controller circuitry IC35.

An expansion bus connector, referred to as PIEbus connector P2, is located along the right edge of processor board 10A. The location of connector P2 also is determined by the VMEbus specification. Connector P2 of industrial I/O controller 10 is electrically isolated from the VMEbus connector P1, and therefore is located as far from connector P1 as possible. Isolation control circuitry 38B, which includes IC51, IC56, IC60, IC66, IC72, IC78, and IC84, is located immediately to the left of expansion bus connector P2. Optical coupler circuitry 37, which provides optical coupling between PIEbus connector P2, microprocessor address bus 16 and the microprocessor data bus 18, is located immediately to the left of isolation control circuitry 38B.

Isolation control circuitry 38A, which is responsive to CPU 17, is located to the left of optical coupler circuitry 37. Isolation control circuitry 38B is responsive to signals received by the PIEbus connector P2, and is located between PIEbus connector P2 and optical couplers 37. Dynamic random access memory circuitry (DRAM) 24 is located immediately to the left of isolation control circuitry 38A in the lower left corner of the component side of processor board 10A, and includes integrated circuits IC52, IC53, etc., as shown, all of which are dynamic RAM chips. Dynamic RAM control circuitry 24A (IC41, IC46, IC47, and IC48) is located immediately above DRAM 24 immediately to the left of address decode circuitry 24B (IC42), which is located immediately above isolation control circuitry 38A.

All "user I/O", that is input/output operations occurring via PIEbus connector P2 or via either of the daughter boards is electrically isolated by opto couplers 37 from the rest of processor board 10A and from the VMEbus connector P1. This leads to the requirement that there should be as much distance as possible between the electrically isolated section of the processor board and the rest of the board. For example, copper lines from the section of the board including the electrically isolated section should not overlap copper lines from the non-isolated sections on other layers. All of the circuitry of the electrically isolated section therefore should be grouped together, including the connections to the daughter board connectors P6 and P7. In order that the I/O daughter boards be interchangeable, it is necessary that the daughter board connectors P6 and P7 be positioned parallel to each other, and spaced apart essentially as shown in FIG. 6H and also in FIG. 6A. The locations of daughter board connectors P6 and P7 in FIG. 6H allows each of them to make the necessary common connections to the isolation control circuitry 38B.

FIG. 6A shows the location of two I/O daughter boards, either of which can be a digital I/O daughter board 33 or an analog daughter board I/O 34 when they are plugged into processor board 10A. Both FIGS. 6A and 6H show that daughter board connector P6 is located along the lower right edge of processor board 10A, immediately beneath optical coupler circuitry 37 and isolation control circuitry 38B. Daughter board connector P7 is located immediately above optical coupler circuitry 37 and isolation control circuitry 38B. Connector support posts SP1 and SP2 receive connector pins from daughter board support posts SP2 and SP1, respectively, along with daughter board conductor P22. Similarly, connector support posts SP3 and SP4 receive pins from daughter board support posts SP2 and SP1, respectively. As can be seen from the edge views of FIGS. 6C-6F, the clearance between daughter boards 33 and 34 and the upper surface of processor board 10A when the daughter boards are plugged in is very small. The maximum height of all components underneath I/O daughter boards 33 and 34 is only 5 millimeters. This limit is a major constraint in the layout of processor board 10A, because all "tall" components or socketed components (which may have to be interchanged occasionally), such as EPROM 26 (IC1,7) and microprocessor 17 (IC14), must be located in the upper portion of FIG. 6H. The socketed components include EPROM 26, microprocessor 17 and address decode circuit 41. The bus jumper components also are tall and must be located under the daughter boards.

As indicated above, obtaining an optimum layout of the above-indicated major sections of the processor board 10A is essential to obtaining an economical intelligent industrial I/O controller having the above features and capable of fitting into a single VMEbus slot space. The constraints pertaining to the location of the VMEbus connector P1 and the PIEbus connector P2 and the necessity of providing very low profile components beneath the plugged in I/O daughter boards contribute to the difficulty of obtaining an optimum layout. The fact that routing of copper conductors between the leads of the various integrated circuits, connectors, and other components to another will become very complex and inefficient (adding to product cost, and causing deterioration in product performance) if the components of a PC board are not positioned in an optimum manner, also contributes to the difficulty of obtaining an optimum layout.

Those skilled in the art know that it is necessary to minimize line capacitances, and that integrated circuits and connectors should usually be located close to the buses to which they are connected, and that the number of bends in the copper lines on each layer should be minimized (because each bend requires more board space). While these basic rules are simple enough, providing an optimized layout with a minimum number of layers of a multilayer printed circuit board nevertheless is a major challenge, even when computer aided design techniques are used.

Some of the specific considerations in the placement of the main blocks of circuitry shown in FIG. 6G will be described next. The VMEbus interface circuitry 13, 20, must be located as close as possible to the VMEbus connector P1, because the VMEbus specification specifies a maximum capacitance load which implies a maximum copper trace length 2 inches or each VMEbus conductor. Dual port static RAM 23 should be located close to the local VMEbus conductors 14 and 21. A second set of bus transceivers 15 and 22 should be located close to the local VMEbus 14, 21 and microprocessor 17. It is necessary that EPROM 26, interrupt circuitry 28, dynamic RAM 24, programmable timer 25, ACIA circuit 27, and the optical couplers 37 be located as close as possible to microprocessor 17 and that the paths of the connecting copper lines or traces be kept as simple as possible.

Since microprocessor 17 is socketed, it is a tall component, so its location of microprocessor 17 must be closer to the upper edge of processor board 10A than the upper edge of daughter board location indicated by line 87 in FIG. 6A. By locating microprocessor 17 centrally in the upper portion of processor board 10A, the lengths of some of the microprocessor bus lines 16, 18 can be kept to a minimum and the distribution of such lines can be simplified. However, the interrupt circuitry 28 and 28A is connected to the VMEbus and should be as close as possible to connector P1 of processor board 10A and as close as possible to IC38 and IC10. The programmable timer module 25, the dynamic RAM controller 24A, and the dynamic RAM address decode circuitry 24B should be located so that the copper trace lengths of buses 16 and 18 are minimized and their paths are simple. The above-illustrated placement of microprocessor 17, EPROM 26, SRAM 23, interrupt circuitry 28, DRAM 24 and optical couplers 37 results in the shortest, most compact routing of the microprocessor address bus conductors 16, the microprocessor data bus conductors 18, the local VMEbus conductors 14 and 21 and the VMEbus conductors 11, subject to the above constraints imposed by the location of the VMEbus connector P1, the maximum line capacitance criteria, and the necessity that the industrial I/O handler 10 occupy only one VMEbus back plane slot space. The remaining components of the processor board 10A are positioned in the areas left available between the above sections. The processor board 10A includes approximately 100 integrated circuits, leaving approximately 40 more to be placed on the two daughter boards.

The integrated circuits included in DRAM 24 are located in the lower left corner of the processor board 10A partly because the address and data bus conductors connected to those ICs are very dense (therefore the DRAM ICs should be placed in a very regular pattern), and because those ICs are not socketed, and therefore have a low profile and can be placed underneath the daughter boards. This location for DRAM 24 also is partly determined by the fact that the isolation control circuitry 38B should to be positioned closer to the PIEbus connector P2. All of the optically isolated circuitry, including daughter board connectors P6 and P7, optical couplers 37, and a first section 38A of the isolation control circuitry should be located close to the P2 connector and as far as practical from the VMEbus connector P1. A second section 38B of the isolation control circuitry should be located as close as possible to the optical couplers 37 and the P2 converter.

It should be noted that by the time the VMEbus interface circuitry, the PIEbus interface circuitry, and the daughter board connectors have been positioned, and space has been reserved for the connectors on the daughter boards and the front panel, and its attachment brackets, approximately 25 percent of the available board area has been consumed. The challenge was to get all of the circuitry except the analog I/O circuitry and digital I/O circuitry on the remaining 75 percent of the area of the processor board, subject to the line routing constraints, capacitance constraints, and component height constraints.

In partitioning the components among processor board 10A and the two I/O daughter boards, functional considerations dominate. It is not possible to simply take the integrated circuits that do not fit on the processor board 10A and locate them on the I/O daughter boards, because inefficient interconnections would result and would require more connector pins than would be acceptable, increasing the amount of processor board area required for connectors and necessitating inefficient routing of copper lines on both the processor board and the daughter board. It was found that partitioning the components into those required for the processor, memory, and interrupt circuitry onto the processor board 10A and locating all I/O circuitry on the digital I/O daughter board and analog I/O daughter board were most efficient from the viewpoints of minimizing connector requirements and minimizing interconnection lengths and the number of required multilayer board layers, and convenience of product packaging.

It was found that the topography of the analog I/O daughter board is very dense, but that the design of the digital I/O daughter board was straightforward. Therefore, the topography of the digital I/O daughter board is not shown or described herein.

Figure 7:
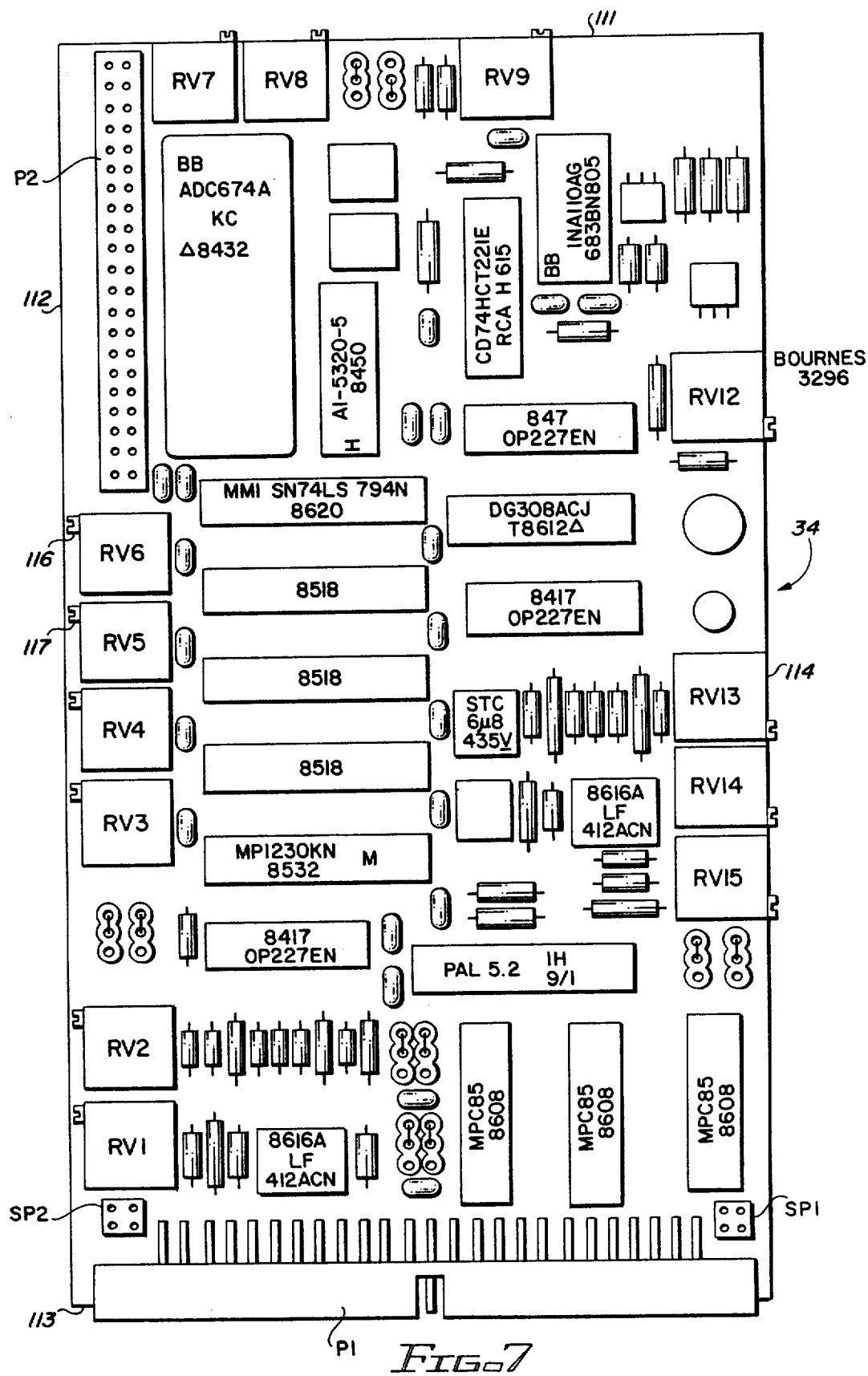
FIG. 7 is a plan view of the component side of the daughter analog I/O board of the industrial I/O controller.
Figure 7A:
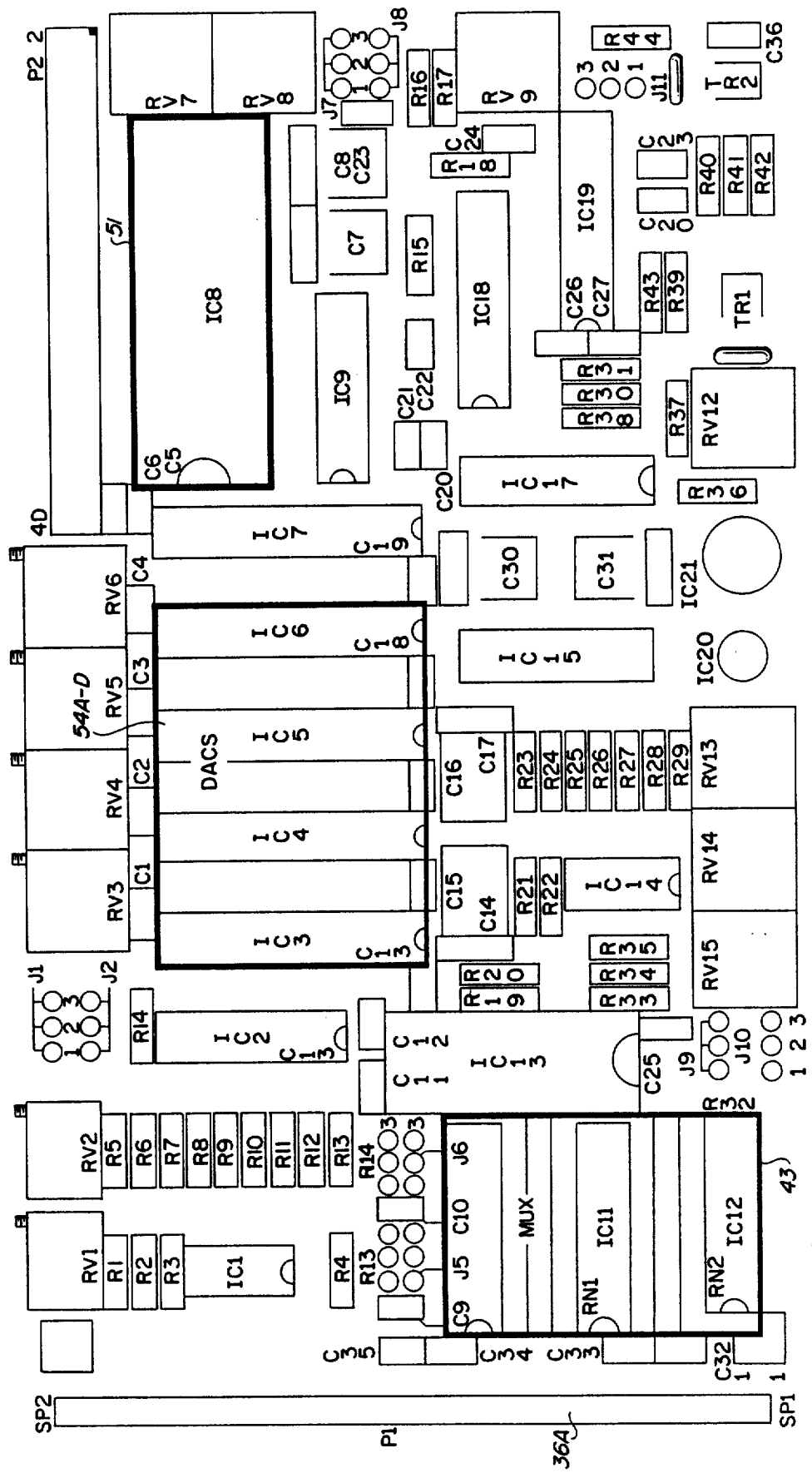
FIG. 7A is an assembly drawing of the component side of the analog I/O daughter board of the industrial I/O controller, with major sections heavily outlined and labelled.
Figure 7C:
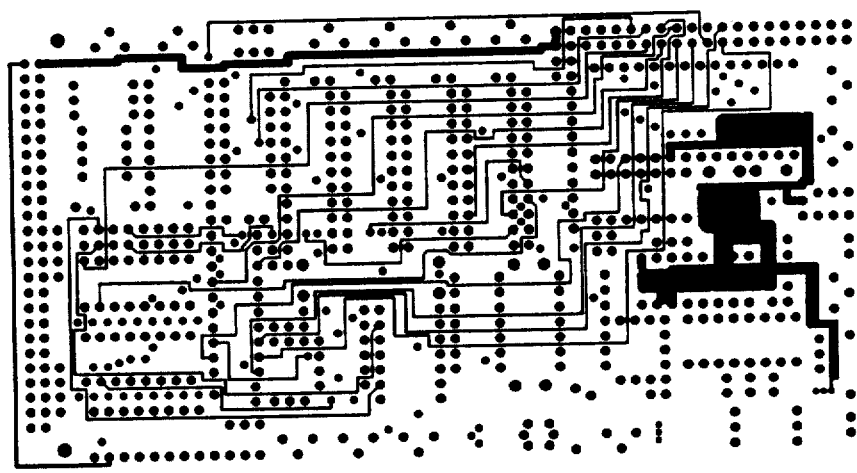
Figure 7D:
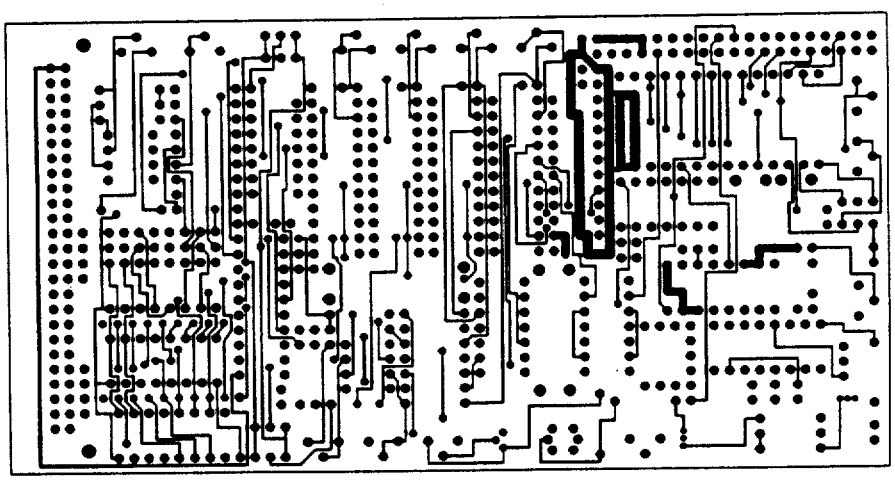

FIG. 7 shows a plan view of the component side of analog I/O daughter board 34. RV1, RV2 ... RV9 and RRV12-RV15 show the location of potentiometers along the three edges 111, 112, and 114 of the daughter board 34. FIG. 7A is a plan scale assembly drawing of the component side of the analog I/O daughter board 34. Table 2 indicates the commercial product descriptions of the various integrated circuits designated in FIG. 7A.

TABLE 2

| IC # | PART # |
|------|--------|
| IC1  | LF412 dual OP amp |
| IC2  | OP227 dual OP amp |
| IC3  | MP1230 12 bit DAC |
| IC4  | MP1230 12 bit DAC |
| IC5  | MP1230 12 bit DAC |
| IC6  | MP1230 12 bit DAC |
| IC7  | 74LS794 octal read back latch |
| IC8  | ADC 675 12 bit ADC |
| IC9  | 5230 sample and hold amplifier |
| IC10 | MPC8S 8 input analog multiplexer |
| IC11 | MPC8S 8 input analog multiplexer |
| IC12 | MPC8S 8 input analog multiplexer |
| IC13 | 16L8 PAL |
| IC14 | LF412 |
| IC15 | OP227 |
| IC17 | DG303 DPDT dual switch |
| IC18 | 74221 dual monostable |
| IC19 | INA110 instrumentation amplifier |
| IC20 | ZN050 5 volt reference |
| IC21 | ZN100 10 volt reference |

A major constraint in the design of the analog I/O daughter board 34 was the fact it is necessary that these potentiometers be adjustable by the user while the analog I/O daughter board 34 is operating under control of the processor board 10A. This requirement necessitated that the potentiometers RV1-RV15 be located around the perimeter of the analog I/O daughter board and that their adjustment screws be accessible by a screwdriver when that daughter board is plugged into the processor board. Another constraint in designing the topography of the daughter board 34 is that the multiplexer 43 (FIG. 2) be located close to the I/O connector P1 designated by reference numeral 36A. Multiplexer 43 includes IC10, IC11, and IC12 in FIG. 7A. Another constraint was that the trimming potentiometers which are associated with the digital-to-analog converters (DACs) 54A-54D should be located close to those DACs. Similarly, the potentiometers associated with adjustment of analog-to-digital converter (ADC) 51 should be physically located close to it. As always, there was a requirement that the copper line routing on the various layers connecting the components be kept as short as possible to minimize capacitance and resistance. This is especially important to good analog circuit performance. Both the analog I/O daughter board 34 and the digital I/O daughter board 33 should be the same size, so they can be interchanged for different I/O requirements, allowing either the number of digital channels or the number of analog channels to be doubled. The DAC output buffers 55A-D need to be located as close as possible to the outputs of DACs 54A-D, which include IC1, IC2, IC14, and IC17. IC19 is the instrumentation amplifier 47 and the sample and hold circuit 50 is IC9.

As shown in FIG. 6, analog I/O daughter board 34 is inverted before it is mounted on processor board 10A, so the pins of its connector P22 mate with the socket of connector P6 or P7 of the processor board 10A. Similarly, the pins of support posts SP1 and SP2 of daughter board 34 need to mate with the pin receiving holes of SP2 and SP1 of processor board 10A or with the receiving holes of support posts connectors SP4 and SP3 of processor board 10A.

FIG. 7A also indicates the location of the multiplexer 43, which includes IC10, IC11, and IC12, the digital-to-analog converters 54A-54D, and analog-to-digital converter 51.

The above-described topography makes it possible to provide an intelligent industrial I/O controller based on a Motorola 68000 microprocessor operating at 10 megahertz and including 512 kilobytes of program memory, 16 kilobytes of dual ported data memory, 128 bytes of EPROM, an RS232 serial interface port, VMEbus interrupt generating and handling circuitry, and up to 32 channels of digital input/output capability or up to 32 analog channels, in a structure in which the on-board microprocessor may take control of the VMEbus transfer data from data to or from another PC board connected to the VMEbus and dramatically reducing the number of VMEbus accesses required during I/O operations.

While the invention has been described with reference to a particular embodiment thereof, those skilled in the art will be able to make various modifications to the described embodiment of the invention without depart from the true spirit and scope thereof. It is intended that all elements and steps which perform substantially the same function in substantially the same manner to achieve the same result are within the scope of the invention. For example, the buffers 15 and 22 and dual port SRAM 23 could be omitted if additional circuitry and software were supplied to allow the VMEbus and the microprocessor 17 to time share bus 16,18. It might be possible to make a somewhat competitive I/O controller in which only two of the four features including the ROM 26, ACIA 27, interrupt handler 28 and interrupt generator 28A are included.

I claim:

1. An industrial input/output controller for connection to a bus on a back plane, comprising in combination:

(a) a processor board having right, left, upper, and lower edges, including a first connector for plug-in connection to a VMEbus connector on the back plane, a first buffer circuit connected to the first connector, a first address bus and a first data bus each connected to the first buffer circuit, a dual port random access memory connected to the first address bus and the first data bus, a second buffer circuit connected to the first address bus and the first data bus, a second address bus and a second data bus each connected to the second buffer circuit, a microprocessor, a random access memory, read-only memory, an asynchronous communications interface adaptor, a programmable timer module, interrupt handling and generation circuitry, electrical isolation circuitry each connected to the second address bus and the second data bus, a third address bus and a third data bus each connected to the electrical isolation circuitry, and second and third connectors each connected to both the third address bus and the third data bus;

(b) a first daughter board having right, upper, left, and lower edges including a fourth connector, a fifth connector, and first I/O circuitry connected between the fourth and fifth connectors;

(c) a second daughter board having right, upper, left, and lower edges, including a sixth connector, a seventh connector, and second I/O circuitry connected between the sixth and second connectors;

the first and second daughter boards being attached in close parallel relationship, the fourth connector of the first daughter board being plugged into the second connector of the processor board and the sixth connector of the second daughter board being plugged into the third connector of the processor board both to electrically connect the first and second daughter boards to the third address bus and the third data bus and rigidly attach the first and second daughter boards and the processor board, the fifth and seventh connectors being available for connection of external I/O conductors to the first and second daughter boards, respectively, the first and second daughter boards covering a first area comprising approximately the lower two-thirds of the component side of the processor board, a second area including approximately the upper one-third of the component side of the processor board, the first connector being located along the right edge of the processor board adjacent to the upper edge thereof, the first buffer circuit being located partly in the second area and partly in the first area adjacent to the first connector, the random access memory, a first portion of the second buffer circuit, and the read-only memory being located in the second area from right to left along the upper edge of the processor board, the microprocessor being located below the first portion or the second buffer circuitry, a second portion of the second buffer circuit being located between the microprocessor and the first buffer circuit below the random access memory, the interrupt handling and generation circuitry being located in the first area adjacent to the first buffer circuit, the second connector being located in the first area along the lower edge of the processor board adjacent to the lower portion of the right edge thereof, a first portion of the isolation control circuitry being located in the first area along the lower portion of the right edge of the processor board above the second connector, the third connector being parallel to the second connector and located in the first area above the first portion of the isolation control circuitry beneath the interrupt handling and generation circuitry and the first buffer, the electrical isolation circuitry being located in the first area to the left of the first portion of the isolation control circuitry between the second and third connectors, a second portion of the isolation control circuitry being located in the first area to the left of the electrical isolation circuitry, the random access memory being located in the first area in the lower left corner of the component side of the processor board to the left of the second portion of the isolation control circuitry whereby only a single slot space for connection to the VME bus is required.

2. The I/O controller of claim 1 wherein the distance from the outer surface of the plugged-in daughter board to the outer surface of the processor board is approximately 10 millimeters.

3. The I/O controller of claim 2 wherein the ROM is located in the second area outside of the first area adjacent to the second daughter board, the ROM and microprocessor being inserted in sockets and having upper surfaces that extend too far upward from the processor board to clear the surfaces of components and connectors attached to the component side of the plugged-in daughter boards.

4. The I/O controller of claim 3 wherein the first daughter board is an analog I/O daughter board including an analog multiplexer circuitry connected to the third connector, means for coupling the output of the analog multiplexer to the input of an analog-to-digital converter, the outputs of the analog-to-digital converter being coupled to the fourth connector.

5. The I/O controller of claim 4 wherein the first daughter board is a digital I/O daughter board including a plurality of digital data storage circuits, digital output buffers, and receiver circuits, and digital control logic circuits.

6. An input/output controller for connection to a VMEbus on a back plane, comprising in combination:

(a) a processor board having a component side and right, left, upper, and lower edges, including on the component side a first connector for plug-in connection to a VMEbus connector on the back plane, a first buffer circuit connected to the first connector, a first address bus and a first data bus each connected to the first buffer circuit, a dual port static random access memory connected to the first address bus and the first data bus, a second buffer circuit connected to the first address bus and the first data bus, a second address bus and a second data bus each connected to the second buffer circuit, a microprocessor, a dynamic random access memory, an electrically programmable read-only memory, a asynchronous communications interface adaptor, a programmable timer module, interrupt handling circuitry, interrupt generation circuitry, bus arbitration and control circuit, and optical isolation circuitry each connected to the second address bus and the second data bus, a third address bus and a third data bus each connected to the optical isolation circuitry, and second and third connectors each connected to both the third address bus and the third data bus;

(b) a first daughter board having a component side and right, upper, left, and lower edges including on its component side a fourth connector, a fifth connector, and first I/O circuitry connected between the fourth and fifth connectors;

(c) a second daughter board having a component side and right, upper, left, and lower edges, including on its component side a sixth connector, a seventh connector, and second I/O circuitry connected between the sixth and second connectors;

the component sides of first and second daughter boards being attached in close parallel relationship to the component side of processor board, the fourth connector of the first daughter board being plugged into the second connector of the processor board and the sixth connector of the second daughter board being plugged into the third connector of the processor board both to electrically connect the first and second daughter boards to the third address bus and the third data bus and rigidly attach the first and second daughter boards and the processor board, the fifth and seventh connectors being available for connection of external I/O conductors to the first and second daughter boards, respectively, the first and second daughter boards covering a first area comprising approximately the lower two-thirds of the component side of the processor board, a second area including approximately the upper one-third of the component side of the processor board, the first connector being located along the right edge of the processor board adjacent to the upper edge thereof, the first buffer circuit being located partly in the second area and partly in the first area adjacent to the first connector, the static random access memory, a first portion of the second buffer circuit, and the electrically programmable read-only memory being located in the second area from right to left along the upper edge of the processor board, the microprocessor being located below the first portion of the second buffer circuitry, a second portion of the second buffer circuit being located between the microprocessor and the first buffer circuit below the static random access memory, the interrupt handling circuitry and interrupt generation circuitry being located in the first area adjacent to the first buffer circuit below the second portion of the second buffer circuit and below the microprocessor, the bus arbitration and control circuit being located below and adjacent to the interrupt generation circuit, the second connector being located in the first area along the lower edge of the processor board adjacent to the lower portion of the right edge thereof, a first portion of the isolation control circuitry being located in the first area along the lower portion of the right edge of the processor board above the second connector, the third connector being parallel to the second connector and located in the first area above the first portion of the isolation control circuitry beneath the interrupt generation circuitry and the first buffer, the optical isolation circuitry being located in the first area to the left of the first portion of the isolation control circuitry between the second and third connectors, a second portion of the isolation control circuitry being located in the first area to the left of the optical isolation circuitry, the dynamic random access memory being located in the first area in the lower left corner of the component side of the processor board to the left of the second portion of the isolation control circuitry.

7. The input/out-put controller of claim 6 wherein the fourth connector is located along the right upper portion of the first daughter board and the fifth connector is located along the left edge of the first daughter board, and the sixth connector is located along the right portion of the upper edge of the second daughter board and the seventh connector is located along the left edge of the second daughter board.

8. The input/output controller of claim 7 including an elongated mounting panel attached to the left edge of the processor board, the mounting panel including an elongated panel perpendicular to the plane of the processor board and extending above the component face thereof above all components thereon and above the first and second daughter boards, the mounting panel having first and second openings therein exposing the fifth and seventh connectors, respectively.

9. The input/output controller of claim 8 wherein the first daughter board includes analog I/O circuitry, including multiplexer circuitry located in the lower left corner of the component side thereof, a plurality of digital-to-analog converter circuits located centrally in the upper half portion of the component side thereof, an analog-to-digital converter located in the upper right corner adjacent to the fourth connector, and a plurality of potentiometers located along the upper, right, and lower edges of the first daughter board with adjustment elements protruding outwardly in directions parallel to the plane of the first daughter board.

10. The input/output controller of claim 9 wherein the processor board includes a dynamic random access memory controller circuit located in the first area adjacent to the dynamic random access memory.

11. The input/output controller of claim 10 wherein the electrically programmable read-only memory, the static random access memory, and the microprocessor are socketed components, the upper portions of which extend further from the component surface of the processor board than the outer surfaces of components on the component side of the first and second daughter boards.

12. The input/output controller of claim 11 wherein the microprocessor is a Model 68000 series microprocessor, the electrically programmable read-only memory includes 128 kilobytes of storage, the static random access memory includes 16 kilobytes of storage, and the dynamic random access memory includes 512 kilobytes of storage.

13. The input/output controller of claim 12 including an eighth connector located along the lower portion of the right edge of the processor board adjacent to the second portion of the isolation control circuitry.

14. The input/output controller of claim 13 wherein the lengths of the left edge and upper edge of the processor board are approximately 6.3 inches and 9.2 inches, respectively.

* * * * *